United States Patent
Siau et al.

(10) Patent No.: US 9,715,925 B2
(45) Date of Patent: Jul. 25, 2017

(54) METHODS AND APPARATUS FOR VERTICAL CROSS POINT RE-RAM ARRAY BIAS CALIBRATION

(71) Applicant: SanDisk 3D LLC, Milpitas, CA (US)

(72) Inventors: Chang Siau, Saratoga, CA (US); Tianhong Yan, Saratoga, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 103 days.

(21) Appl. No.: 14/502,093

(22) Filed: Sep. 30, 2014

(65) Prior Publication Data

US 2016/0093374 A1 Mar. 31, 2016

(51) Int. Cl.
*G11C 13/00* (2006.01)

(52) U.S. Cl.
CPC ........ *G11C 13/004* (2013.01); *G11C 13/0002* (2013.01); *G11C 13/0021* (2013.01); *G11C 13/0033* (2013.01); *G11C 13/0038* (2013.01); *G11C 13/0069* (2013.01); *G11C 2013/0076* (2013.01); *G11C 2207/2254* (2013.01); *G11C 2213/71* (2013.01)

(58) Field of Classification Search
CPC ................................................. G11C 13/0069
USPC ......................................................... 365/148
See application file for complete search history.

(56) References Cited

U.S. PATENT DOCUMENTS

| | | | | |
|---|---|---|---|---|
| 7,542,338 B2* | 6/2009 | Scheuerlein | .......... | G11C 11/565 365/185.03 |
| 9,595,323 B1* | 3/2017 | Chen | ........................ | G11C 11/16 |
| 2002/0048185 A1* | 4/2002 | Thewes | .................... | G11C 11/16 365/158 |
| 2002/0175357 A1* | 11/2002 | Kim | ........................ | B82Y 10/00 257/296 |
| 2008/0025134 A1* | 1/2008 | Scheuerlein | .......... | G11C 7/1048 365/230.06 |
| 2008/0094876 A1* | 4/2008 | Siau | ......................... | G11C 11/16 365/148 |
| 2008/0094929 A1* | 4/2008 | Rinerson | ................ | G11C 11/16 365/208 |
| 2010/0165711 A1* | 7/2010 | Lee | ...................... | G11C 13/0004 365/163 |
| 2010/0290272 A1* | 11/2010 | Yoon | ................... | G11C 13/0004 365/163 |
| 2010/0321977 A1* | 12/2010 | Sekar | ........................ | G11C 7/00 365/148 |
| 2011/0069533 A1* | 3/2011 | Kurosawa | ................ | G11C 8/12 365/148 |
| 2011/0299340 A1* | 12/2011 | Samachisa | ............. | G11C 16/06 365/185.21 |
| 2012/0147650 A1* | 6/2012 | Samachisa | .......... | G11C 13/0002 365/51 |

(Continued)

*Primary Examiner* — Anthan Tran
*Assistant Examiner* — Mushfique Siddique
(74) *Attorney, Agent, or Firm* — Vierra Magen Marcus LLP

(57) ABSTRACT

Methods for operating a non-volatile storage system are described. The non-volatile storage system includes a plurality of bit lines, a plurality of word line combs each comprising a plurality of word lines, and a plurality of resistance-switching memory elements. Each resistance-switching memory element is coupled between one of the bit lines and one of the word lines. The method includes calibrating a plurality of bias voltages for the word lines and bit lines based on estimates of data values stored in the resistance-switching memory elements.

18 Claims, 17 Drawing Sheets

(56) References Cited

U.S. PATENT DOCUMENTS

| | | | |
|---|---|---|---|
| 2012/0147689 A1* | 6/2012 | Scheuerlein | G11C 13/0002 365/230.03 |
| 2013/0100743 A1* | 4/2013 | Lue | G11C 16/04 365/185.18 |
| 2013/0188431 A1* | 7/2013 | Scheuerlein | G11C 7/04 365/189.09 |
| 2014/0063907 A1* | 3/2014 | Matsunami | G11C 13/0064 365/148 |
| 2014/0233329 A1* | 8/2014 | Chen | G11C 7/00 365/189.011 |
| 2014/0254242 A1* | 9/2014 | Siau | G11C 13/0026 365/148 |
| 2015/0036414 A1* | 2/2015 | Yan | G11C 13/003 365/148 |
| 2015/0332760 A1* | 11/2015 | Kim | G11C 11/161 711/125 |
| 2016/0019961 A1* | 1/2016 | Ratnam | G11C 13/004 365/148 |
| 2016/0019980 A1* | 1/2016 | Jeong | G11C 11/5607 365/148 |
| 2016/0020254 A1* | 1/2016 | Park | H01L 45/1253 257/329 |
| 2016/0027477 A1* | 1/2016 | Petti | G11C 5/02 365/51 |
| 2016/0064650 A1* | 3/2016 | Wang | H01L 27/228 257/427 |
| 2016/0093373 A1* | 3/2016 | Siau | G11C 13/004 365/148 |
| 2016/0133324 A1* | 5/2016 | Alrod | G11C 13/0097 365/148 |
| 2016/0133836 A1* | 5/2016 | Lan | H01L 45/16 365/51 |
| 2016/0170682 A1* | 6/2016 | Bakshi | G06F 3/0649 711/103 |

* cited by examiner

METHODS AND APPARATUS FOR VERTICAL CROSS POINT RE-RAM ARRAY BIAS CALIBRATION

BACKGROUND

The present disclosure relates to technology for non-volatile storage.

One example of non-volatile memory uses resistance-switching memory elements that may be set to either a low resistance state or a high resistance state. The variable resistance memory elements may be individually connected between two conductors (e.g., a bit line electrode and a word line electrode). The state of such a memory element is typically changed by voltages being placed on the intersecting conductors.

In recent years, non-volatile memory arrays have been proposed that use resistance-switching memory elements without selection devices. Such memory arrays present numerous design and process challenges.

DETAILED DESCRIPTION

Figure 1:
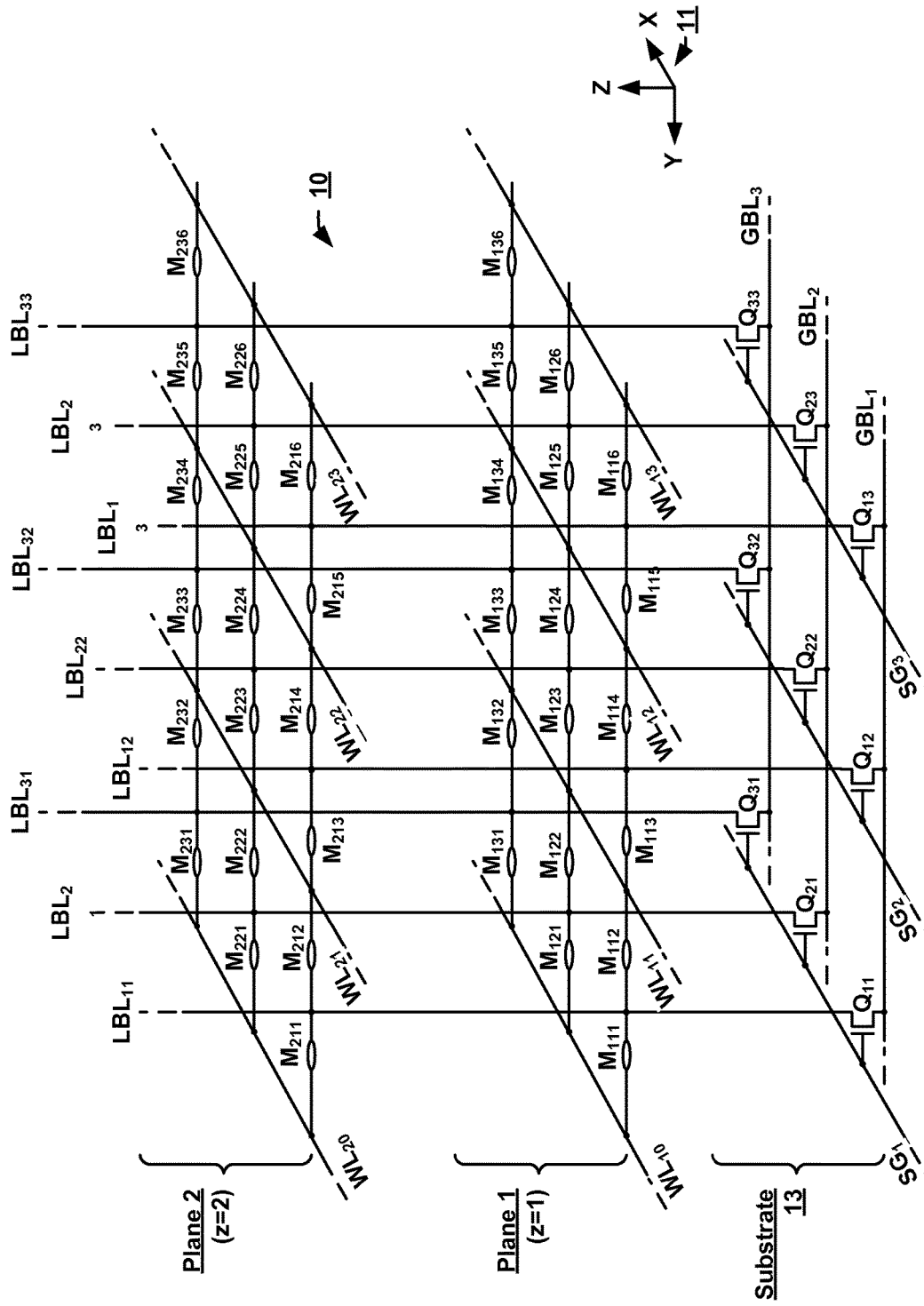
FIG. 1 is an equivalent circuit of a portion of an example three-dimensional array of resistance-switching memory elements, wherein the array has vertical bit lines.

Technology is described for calibrating bias voltages applied to bit lines and word lines in a cross-point memory array. In particular, technology is described for calibrating bias voltages applied to bit lines and word lines based on estimates of data values stored in resistance-switching memory elements of the cross-point memory array.

A cross-point memory array includes memory elements (also referred to herein as "memory cells") that are placed at the intersections of a first set of control lines (e.g., word lines) arranged in a first direction and a second set of control lines (e.g., bit lines) arranged in a second direction perpendicular to the first direction. A three-dimensional cross-point memory array includes vertical bit lines or bit lines that are arranged orthogonal to a semiconductor substrate.

The memory cells used in a three-dimensional cross-point memory array may be resistance-switching memory cells. That is, the resistance (and thus inversely the conductance) of the individual memory cells typically is changed as a result of a voltage placed across the orthogonally intersecting conductors to which the memory cell is connected. Depending on the type of resistance-switching memory cell, the state may change in response to a voltage across it, a level of current though it, an amount of electric field across it, a level of heat applied to it, and the like.

With some resistance-switching memory cell material, the amount of time that the voltage, current, electric field, heat and the like is applied to the element determines when its conductive state changes and the direction in which the change takes place. In between such state changing operations, the resistance of the memory cell remains unchanged, so is non-volatile. The three-dimensional cross-point memory array architecture described herein may be implemented with a memory cell material selected from a wide variety of such materials having different properties and operating characteristics.

The resistance of the memory cell, and thus its detectable storage state, can be repetitively set from an initial level to another level and then re-set back to the initial level. For some materials, the amount or duration of the voltage, current, electric field, heat and the like applied to change its state in one direction is different (asymmetrical) with that applied to change in another direction. With two detectable states, each memory cell stores one-bit of data. With the use of some materials, more than one bit of data may be stored in each memory cell by designating more than two stable levels of resistance as detectable states of the memory cell. The three-dimensional cross-point memory array architecture herein is quite versatile in the way it may be operated.

In addition, the three-dimensional architecture herein allows variable resistance memory cells to be connected at orthogonal crossings of bit and word line conductors without the need for diodes or other non-linear elements being connected in series with the variable resistive elements. In existing arrays of variable resistance memory cells, a diode is commonly connected in series with each memory cell to reduce the leakage current though the element when it is unselected but nevertheless has a voltage difference placed across it, such as can occur when the unselected memory cell is connected to a bit or word line carrying voltages to selected memory cells connected to those same lines.

Referring to FIG. 1, an architecture of an example embodiment of a three-dimensional (3D) memory array 10 is illustrated in the form of an equivalent circuit of a portion of such a memory. A standard three-dimensional rectangular coordinate system 11 is used for reference, the directions of each of vectors x, y and z being orthogonal with the other two. In an embodiment, the word lines and bit lines of a memory array may cross at an angle equal to or about 90 degrees. In another embodiment, the word lines and bit lines of a memory array may cross at an angle equal to or about 60 degrees.

Memory cells $M_{zxy}$ are formed in a plurality of planes positioned at different distances in the z-direction above the substrate 13. Two planes 1 and 2 are illustrated in FIG. 1, but typically there will be more planes, such as 4, 6, 8, 16, 32, or even more. In each plane at distance z, word lines $WL_{zy}$ are elongated in the x-direction and spaced apart in the y-direction between the local bit-lines ($LBL_{xy}$). The word lines $WL_{zy}$ of each plane individually cross adjacent two of the local bit-lines $LBL_{xy}$ on either side of the word lines.

Individual memory storage elements $M_{zxy}$ are connected between one local bit line $LBL_{xy}$ and one word line $WL_{zy}$ adjacent these individual crossings. An individual memory cell $M_{zxy}$ is therefore addressable by placing proper voltages on the local bit line $LBL_{xy}$ and word line $WL_{zy}$ between which the memory cell is connected. The voltages are chosen to provide the electrical stimulus necessary to cause the state of the memory cell to change from an existing state to the desired new state. The levels, duration and other characteristics of these voltages depend upon the material that is used for the memory cells.

Each "plane" of the three-dimensional memory structure is typically formed of at least two layers, one in which the conductive word lines $WL_{zy}$ are positioned and another of a dielectric material that electrically isolates the planes from each other. Additional layers also may be present in each plane, depending for example on the structure of the memory cells $M_{zxy}$. The planes are stacked on top of each other above semiconductor substrate 13 with the local bit lines $LBL_{xy}$ being connected with storage elements $M_{zxy}$ of each plane through which the local bit lines extend.

A circuit for selectively connecting internal memory cells with external data circuits is preferably formed using select devices $Q_{xy}$, where x gives a relative position of the device in the x-direction and y its relative position in the y-direction. The individual select devices $Q_{xy}$ may be a select gate or select transistor, as examples. Global bit lines ($GBL_x$) are elongated in the y-direction and have relative positions in the x-direction that are indicated by the subscript.

Global bit lines ($GBL_x$) are individually connectable with the source or drain of the select devices $Q_{xy}$ having the same position in the x-direction, although during reading and also typically programming only one select device connected with a specific global bit line is turned ON at time. The other of the source or drain of the individual select devices $Q_{xy}$ is connected with one of the local bit lines ($LBL_{xy}$). The local bit lines are elongated vertically, in the z-direction, and form a regular two-dimensional array in the x (row) and y (column) directions.

To connect one set (in this example, designated as one row) of local bit lines with corresponding global bit lines, row select lines $SG_y$ are elongated in the x-direction and connect with control terminals (gates) of a single row of select devices $Q_{xy}$ having a common position in the y-direction. The select devices $Q_{xy}$ therefore connect one row of local bit lines ($LBL_{xy}$) across the x-direction (having the same position in the y-direction) at a time to corresponding ones of the global bit-lines ($GBL_x$), depending upon which of the row select lines $SG_y$ receives a voltage that turns ON the select devices to which it is connected. The remaining row select lines receive voltages that keep their connected select devices $Q_{xy}$ OFF. Because only one select device ($Q_{xy}$) is used with each of the local bit lines ($LBL_{xy}$), the pitch of the array across the semiconductor substrate in both x and y-directions may be made very small, and thus the density of the memory storage elements large.

The memory arrays described herein, including 3D memory array 10, are monolithic three dimensional memory arrays. A monolithic three dimensional memory array is one in which multiple memory levels are formed above (and not in) a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other. The substrates may be thinned or removed from the memory levels before bonding, but as the memory levels are initially formed over separate substrates, such memories are not true monolithic three dimensional memory arrays.

Figure 2:
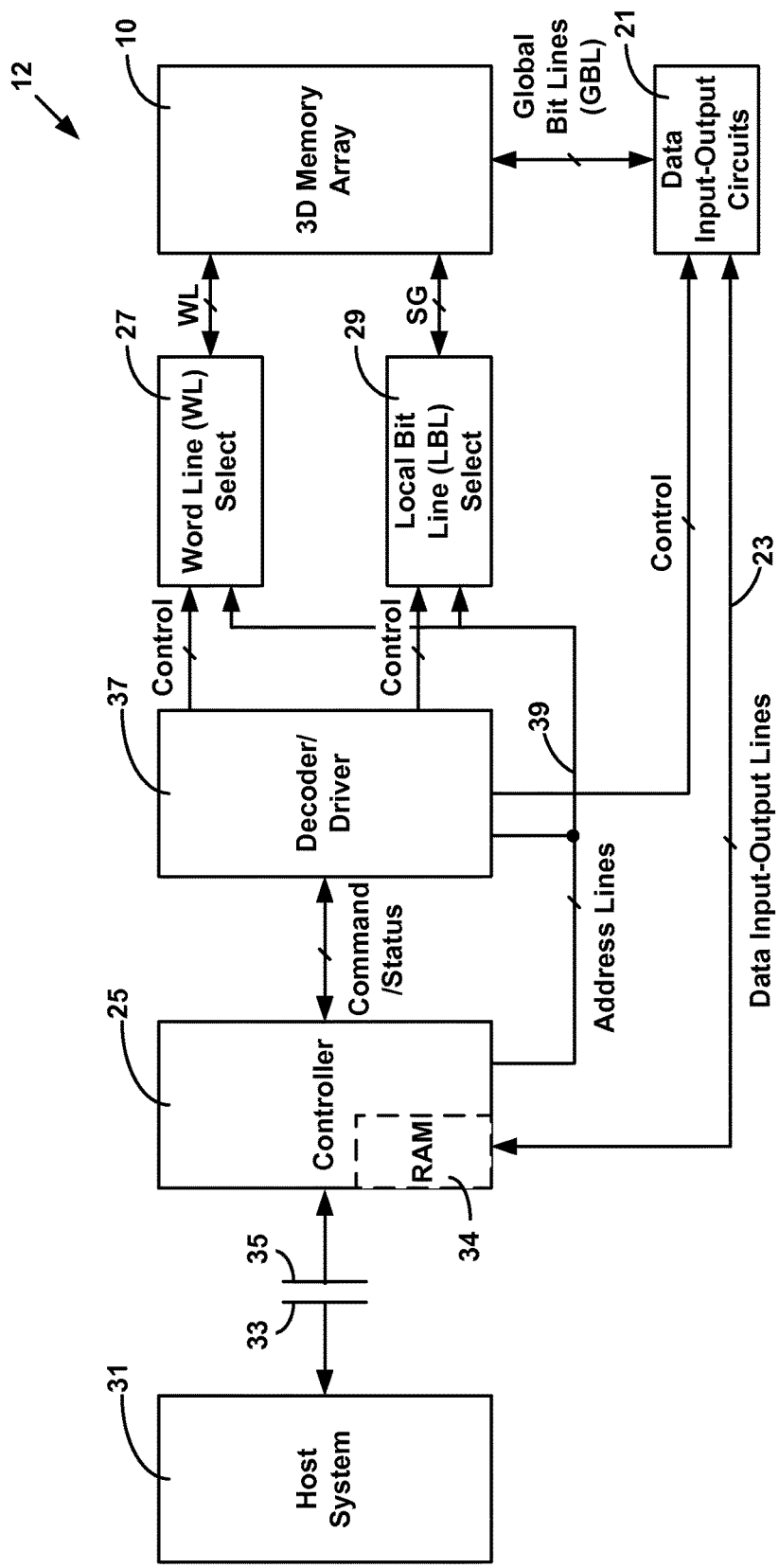
FIG. 2 is a schematic block diagram of a re-programmable non-volatile memory system which utilizes the memory array of FIG. 1, and which indicates connection of the memory system with a host system.

FIG. 2 is a block diagram of an illustrative memory system 12 that can use 3D memory array 10 of FIG. 1. Data input-output circuits 21 are connected to provide (during programming) and receive (during reading) analog electrical quantities in parallel over the global bit-lines $GBL_x$ of FIG. 1 that are representative of data stored in addressed memory cells $M_{zxy}$. Data input-output circuits 21 typically contain sense amplifiers for converting these electrical quantities into digital data values during reading, which digital values are then conveyed over lines 23 to a memory system controller 25. Conversely, data to be programmed into 3D memory array 10 are sent by controller 25 to data input-output circuits 21, which then program that data into addressed memory cells by placing proper voltages on the global bit lines $GBL_x$.

For binary operation, one voltage level is typically placed on a global bit line to represent a binary "1," and another voltage level to represent a binary "0." The memory cells are addressed for reading or programming by voltages placed on the word lines $WL_{zy}$ and row select lines $SG_y$ by respective word line select circuits 27 and local bit line select circuits 29. In the specific three-dimensional array of FIG. 1, the memory cells lying between a selected word line and any of the local bit lines $LBL_{xy}$ connected at one instance through the select devices $Q_{xy}$ to the global bit lines $GBL_x$ may be addressed for programming or reading by appropriate voltages being applied through word line select circuits 27 and local bit line select circuits 29.

Controller 25 typically receives data from and sends data to a host system 31. Controller 25 usually contains an amount of random-access-memory (RAM) 34 for temporarily storing such data and operating information. Commands, status signals and addresses of data being read or programmed are also exchanged between controller 25 and host system 31. Memory system 12 operates with a wide variety of host systems 31, such as personal computers (PCs), laptop and other portable computers, cellular telephones, personal digital assistants (PDAs), digital still cameras, digital movie cameras and portable audio players. Host system 31 typically includes a built-in receptacle 33 for one or more types of memory cards or flash drives that accepts a mating memory system plug 35 of memory system 12 but some host systems 31 require the use of adapters into which a memory card is plugged, and others require the use of cables therebetween. Alternatively, memory system 12 may be built into host system 31 as an integral part thereof.

Controller 25 conveys to decoder/driver circuits 37 commands received from the host system 31. Similarly, status signals generated by memory system 12 are communicated to controller 25 from decoder/driver circuits 37. Decoder/driver circuits 37 can be simple logic circuits, in the case where controller 25 controls nearly all of the memory operations, or can include a state machine to control at least some of the repetitive memory operations necessary to carry out given commands. Control signals resulting from decoding commands are applied from decoder/driver circuits 37 to word line select circuits 27, local bit line select circuits 29 and data input-output circuits 21.

Also connected to word line select circuits 27 and local bit line select circuits 29 are address lines 39 from controller 25 that carry physical addresses of memory cells to be accessed within 3D memory array 10 to carry out a command from host system 31 The physical addresses correspond to logical addresses received from host system 31, the conversion being made by controller 25 and/or decoder/driver circuits 37. As a result, local bit line select circuits 29 partially address the designated storage elements within 3D memory array 10 by placing proper voltages on the control elements of the select devices $Q_{xy}$ to connect selected local bit lines ($LBL_{xy}$) with the global bit lines ($GBL_x$). The addressing is completed by word line select circuits 27 applying proper voltages to the word lines $WL_{zy}$ of the array. In one embodiment, any one or combination of controller 25, decoder/driver circuits 37, data input-output circuits 21, word line select circuits 27 and local bit line select circuits 29, or other control logic can be referred to as one or more control circuits.

In some embodiments, one or more managing or control circuits may be used for controlling the operation of a memory array. The one or more managing or control circuits may provide control signals to a memory array to perform a read operation and/or a write operation on the memory array. In one example, the one or more managing or control circuits may include any one of or a combination of control circuitry, state machine, decoders, sense amplifiers, read/write circuits, controllers, and so forth. The one or more managing circuits may perform or facilitate one or more memory array operations including erasing, programming, or reading operations. In one example, one or more managing circuits may comprise an on-chip memory controller for determining row and column address, word line and bit line addresses, memory array enable signals, and data latching signals.

Although memory system 12 utilizes 3D memory array 10 of FIG. 1, the system is not limited to use of only that array architecture. A given memory system may alternatively combine this type of memory with other another type including flash memory, such as flash memory having a NAND memory cell array architecture, a magnetic disk drive or some other type of memory. The other type of memory may have its own controller or may in some cases share controller 25 with 3D memory array 10, particularly if there is some compatibility between the two types of memory at an operational level.

Although each of the memory cells $M_{zxy}$ in 3D memory array 10 of FIG. 1 may be individually addressed for changing its state according to incoming data or for reading its existing storage state, in some embodiments it may be preferable to program and read the array in units of multiple memory cells in parallel. In 3D memory array 10 of FIG. 1, one row of memory cells on one plane may be programmed and read in parallel. The number of memory cells operated in parallel depends on the number of memory cells connected to the selected word line.

In some 3D memories 10, the word lines may be segmented (not shown in FIG. 1) so that only a portion of the total number of memory cells connected along their length may be addressed for parallel operation, namely the memory cells connected to a selected one of the segments. In some 3D memories 10 the number of memory cells programmed in one operation may be less than the total number of memory cells connected to the selected word line to minimize IR drops, to minimize power, or for other reasons.

Previously programmed memory cells whose data have become obsolete may be addressed and re-programmed from the states in which they were previously programmed. The states of the memory cells being re-programmed in parallel will therefore most often have different starting states among them. This is acceptable for many memory cell materials but it is usually preferred to re-set a group of memory cells to a common state before they are re-programmed. For this purpose, the memory cells may be grouped into blocks, where the memory cells of each block are simultaneously reset to a common state, preferably one of the programmed states, in preparation for subsequently programming them.

If the memory cell material being used is characterized by changing from a first to a second state in significantly less time than it takes to be changed from the second state back to the first state, then the reset operation is preferably chosen to cause the transition taking the longer time to be made. The programming is then done faster than resetting. The longer reset time is usually not a problem because resetting blocks of memory cells containing nothing but obsolete data is typically accomplished in a high percentage of the cases in the background, therefore not adversely impacting the programming performance of the memory system.

With the use of block re-setting of memory cells, a three-dimensional array of variable resistive memory cells may be operated in a manner similar to current flash memory arrays. Resetting a block of memory cells to a common state corresponds to erasing a block of flash memory cells to an erased state. The individual blocks of memory cells herein may be further divided into a plurality of pages of storage elements, wherein the memory cells of a page are programmed and read together.

This is like the use of pages in flash memories. The memory cells of an individual page are programmed and read together. Of course, when programming, those memory cells that are to store data that are represented by the reset state are not changed from the reset state. Those of the memory cells of a page that need to be changed to another state in order to represent the data being stored in them have their states changed by the programming operation.

Figure 3:
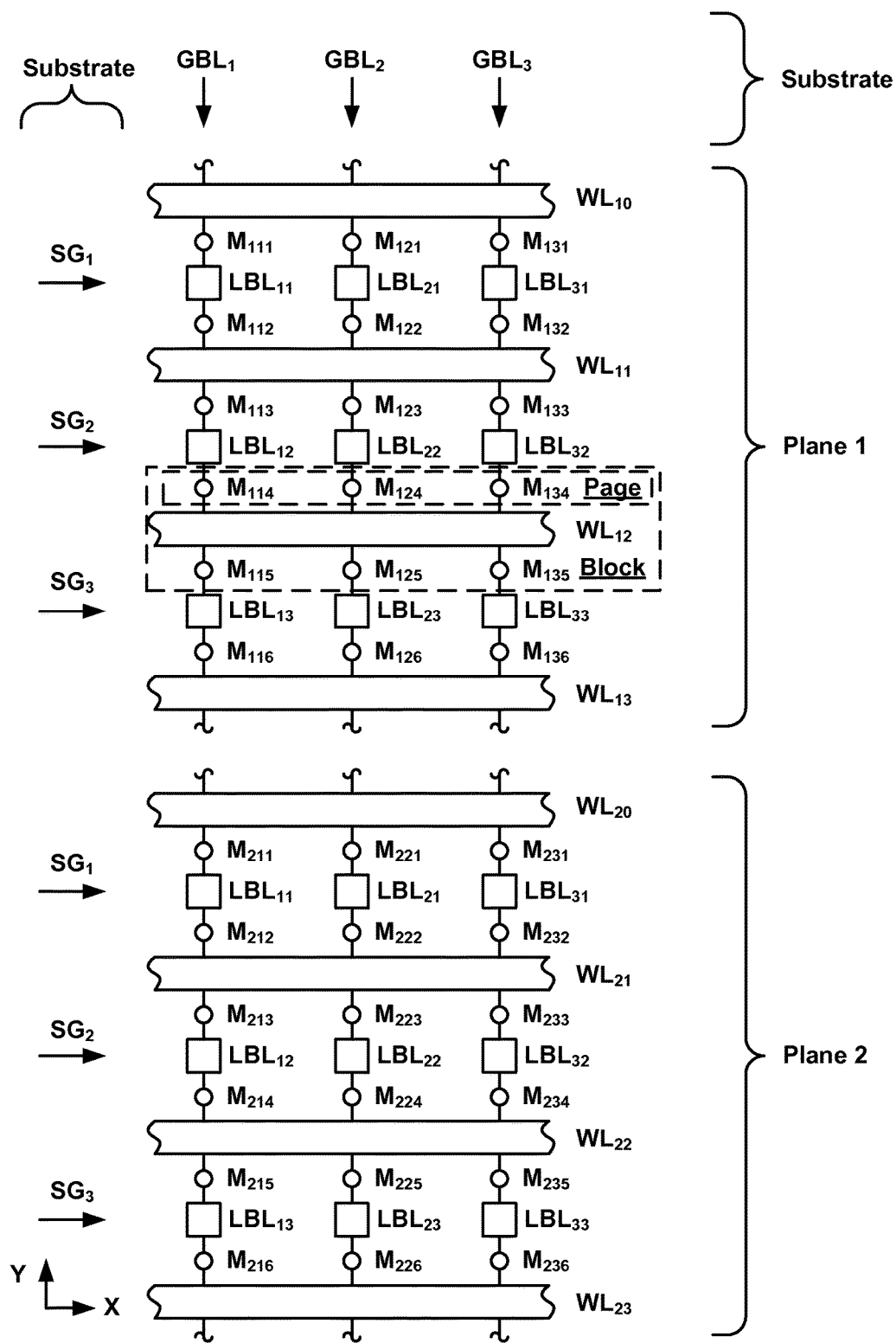
FIG. 3 provides plan views of the two planes and substrate of the three-dimensional array of FIG. 1, with some structure added.

An example of use of such blocks and pages is illustrated in FIG. 3, which provides plan schematic views of planes 1 and 2 of 3D memory array 10 of FIG. 1. The different word lines $WL_{zy}$ that extend across each of the planes and the local bit lines $LBL_{xy}$ that extend through the planes are shown in two-dimensions. Individual blocks are made up of memory cells connected to both sides of one word line, or one segment of a word line if the word lines are segmented, in a single one of the planes. There are therefore a very large number of such blocks in each plane of the array.

In the block illustrated in FIG. 3, each of the memory cells $M_{114}$, $M_{124}$, $M_{134}$, $M_{115}$, $M_{125}$ and $M_{135}$ connected to both sides of one word line $WL_{12}$ form the block. Of course, there will be many more memory cells connected along the length of a word line but only a few of them are illustrated, for simplicity. The memory cells of each block are connected between the single word line and different ones of the local bit lines, namely, for the block illustrated in FIG. 3, between the word line $WL_{12}$ and respective local bit lines $LBL_{12}$, $LBL_{22}$, $LBL_{32}$, $LBL_{13}$, $LBL_{23}$ and $LBL_{33}$.

A page is also illustrated in FIG. 3. In the specific embodiment being described, there are two pages per block. One page is formed by the memory cells along one side of the word line of the block and the other page by the memory cells along the opposite side of the word line. The example page marked in FIG. 3 is formed by memory cells $M_{114}$, $M_{124}$ and $M_{134}$. Of course, a page will typically have a very large number of memory cells in order to be able to program and read a large amount of data at one time. Only a few of the storage elements of the page of FIG. 3 are included, for simplicity in explanation.

Example resetting, programming and reading operations of the memory array of FIGS. 1 and 3, when operated as 3D memory array 10 in the memory system of FIG. 2, will now be described. For these examples, each of the memory cells $M_{zxy}$ is taken to include a non-volatile memory material that can be switched between two stable states of different resistance levels by impressing voltages (or currents) of different polarity across the memory cell, or voltages of the same polarity but different magnitudes and/or duration.

For example, one class of material may be placed into a high resistance state by passing current in one direction through the element, and into a low resistance state by passing current in the other direction through the element. Or, in the case of switching using the same voltage polarity, one element may need a higher voltage and a shorter time to switch to a high resistance state and a lower voltage and a longer time to switch to a lower resistance state. These are the two memory states of the individual memory cells that indicate storage of one bit of data, which is either a "0" or a "1," depending upon the memory cell state.

To reset (e.g., erase) a block of memory cells, the memory cells in that block are placed into their high resistance state. This state will be designated as the logical data state "1," following the convention used in current flash memory arrays, but alternatively it could be designated to be a "0." As shown by the example in FIG. 3, a block includes all the memory cells that are electrically connected to one word line WL or segment thereof. A block is the smallest unit of memory cells in the array that are reset together. It can include thousands of memory cells. If a row of memory cells on one side of a word line includes 1000 of them, for example, a block will have 2000 memory cells from the two rows on either side of the word line.

The following steps may be taken to reset all the memory cells of a block, using the block illustrated in FIG. 3 as an example:
1. Set all of the global bit lines ($GBL_1$, $GBL_2$ and $GBL_3$ in the array of FIGS. 1 and 3) to zero volts, by data input-output circuits 21 of FIG. 2.
2. Set at least the two row select lines on either side of the one word line of the block to H' volts, so that the local bit lines on each side of the word line in the y-direction are connected to their respective global bit lines through their select devices and therefore brought to zero volts. The voltage H' is made high enough to turn ON the select devices $Q_{xy}$, for example, something in a range of 1-6 volts, typically 3 volts. The block shown in FIG. 3 includes the word line $WL_{12}$, so the row select lines $SG_2$ and $SG_3$ (FIG. 1) on either side of that word line are set to H' volts, by local bit line select circuits 29 of FIG. 2, to turn ON select devices $Q_{12}$, $Q_{22}$, $Q_{32}$, $Q_{13}$, $Q_{23}$ and $Q_{33}$. This causes each of local bit lines $LBL_{12}$, $LBL_{22}$, $LBL_{32}$, $LBL_{13}$, $LBL_{23}$ and $LBL_{33}$ in two adjacent rows extending in the x-direction to be connected to respective ones of the global bit lines GBL1, GBL2 and GBL3. Two of the local bit lines adjacent to each other in the y-direction are connected to a single global bit line. Those local bit lines are then set to the zero volts of the global bit lines. The remaining local bit lines preferably remain unconnected and with their voltages floating.
3. Set the word line of the block being reset to H volts. This reset voltage value is dependent on the resistance-switching material in the memory cell and can be between a fraction of a volt to a few volts. All other word lines of the array, including the other word lines of selected plane 1 and all the word lines on the other unselected planes, are set to zero volts. In the array of FIGS. 1 and 3, word line $WL_{12}$ is placed at H volts, and all other word lines in the array are placed at zero volts, all by word line select circuits 27 of FIG. 2.

The result is that H volts are placed across each of the memory cells of the block. In the example block of FIG. 3, this includes the memory cells $M_{114}$, $M_{124}$, $M_{134}$, $M_{115}$, $M_{125}$ and $M_{135}$. For the type of memory material being used as an example, the resulting currents through these memory cells places any of them not already in a high resistance state, into that re-set state.

No stray currents will flow because only one word line has a non-zero voltage. The voltage on the one word line of the block can cause current to flow to ground only through the memory cells of the block. There is also nothing that can drive any of the unselected and electrically floating local bit lines to H volts, so no voltage difference will exist across any other memory cells of the array outside of the block. Therefore no voltages are applied across unselected memory cells in other blocks that can cause them to be inadvertently disturbed or reset.

The memory cells of a page are preferably programmed concurrently, to increase the parallelism of the memory system operation. An expanded version of the page indicated in FIG. 3 is provided in FIG. 4, with annotations added to illustrate a programming operation. The individual memory cells of the page are initially in their reset state because all the memory cells of its block have previously been reset. The reset state is taken herein to represent a logical data "1." For any of these memory cells to store a logical data "0" in accordance with incoming data being programmed into the page, those memory cells are switched into their low resistance state, their set state, while the remaining memory cells of the page remain in the reset state.

For programming a page, only one row of select devices is turned ON, resulting in only one row of local bit lines being connected to the global bit lines. This connection alternatively allows the memory cells of both pages of the block to be programmed in two sequential programming cycles, which then makes the number of memory cells in the reset and programming units equal.

Figure 4:
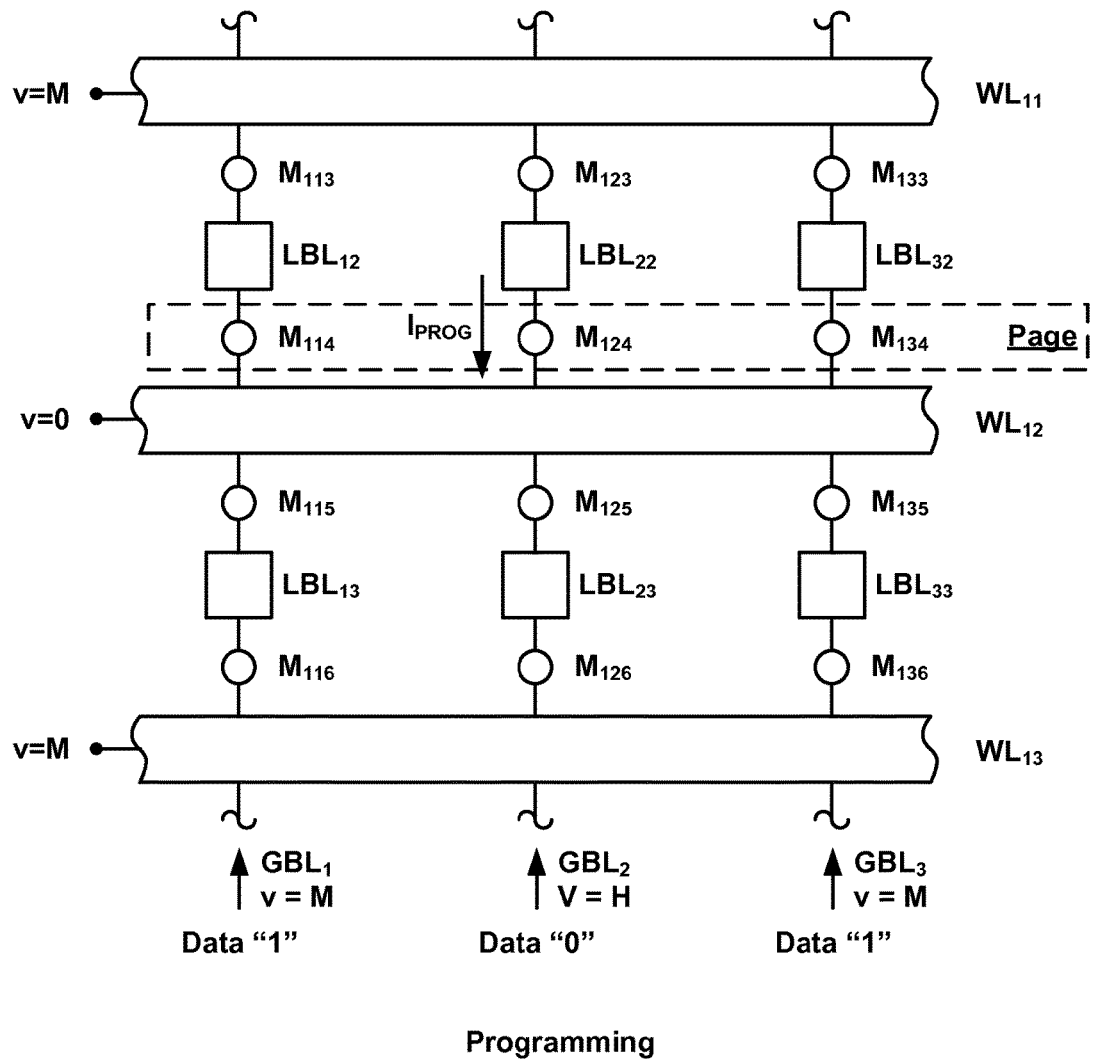
FIG. 4 is an expanded view of a portion of one of the planes of FIG. 3, annotated to show effects of programming data therein.

Referring to FIGS. 3 and 4, an example programming operation within the indicated one page of memory cells $M_{114}$, $M_{124}$ and $M_{134}$ is described, as follows:
1. The voltages placed on the global bit lines are in accordance with the pattern of data received by the memory system for programming. In the example of FIG. 4, $GBL_1$ carries logical data bit "1," $GBL_2$ the logical bit "0," and $GBL_3$ the logical bit "1." The bit lines are set respectively to corresponding voltages M, H and M, as shown, where the M level voltage is high but not sufficient to program a memory cell and the H level is high enough to force a memory cell into the programmed state. The M level voltage may be about one-half of the H level voltage, between zero volts and H. For example, a M level can be 0.7 volt, and a H level can be 1.5 volt. The H level used for programming is not necessary the same as the H level used for resetting or reading. In this case, according to the received data, memory cells $M_{114}$ and $M_{134}$ are to remain in their reset state, while memory cell $M_{124}$ is being programmed. Therefore, the programming voltages are applied only to memory cell $M_{124}$ of this page by the following steps.

2. Set the word line of the page being programmed to 0 volts, in this case selected word line $WL_{12}$. This is the only word line to which the memory cells of the page are connected. Each of the other word lines on all planes is set to the M level. These word line voltages are applied by word line select circuits 27 of FIG. 2.

3. Set one of the row select lines below and on either side of the selected word line to the H' voltage level, to select a page for programming. For the page indicated in FIGS. 3 and 4, the H' voltage is placed on row select line $SG_2$ to turn on select devices $Q_{12}$, $Q_{22}$ and $Q_{32}$ (FIG. 1). All other row select lines, namely lines $SG_1$ and $SG_3$ in this example, are set to 0 volts to keep their select devices off. The row select line voltages are applied by bit line select circuits 29 of FIG. 2. This connects one row of local bit lines to the global bit lines and leaves all other local bit lines floating. In this example, the row of local bit lines $LBL_{12}$, $LBL_{22}$ and $LBL_{32}$ are connected to the respective global bit lines $GBL_1$, $GBL_2$ and $GBL_3$ through the select devices that are turned ON, while all other local bit lines (LBLs) of the array are left floating.

The result of this operation, for the example memory cell material mentioned above, is that a programming current $I_{PROG}$ is sent through the memory cell $M_{124}$, thereby causing that memory cell to change from a reset state to a set (programmed) state. The same will occur with other memory cells (not shown) that are connected between the selected word line $WL_{12}$ and a local bit line (LBL) that has the programming voltage level H applied.

An example of the relative timing of applying the above-listed programming voltages is to initially set all the global bit lines (GBLs), the selected row select line (SG), the selected word line and two adjacent word lines on either side of the selected word line on the one page all to the voltage level M. After this, selected ones of the GBLs are raised to the voltage level H according to the data being programmed while simultaneously dropping the voltage of the selected word line to 0 volts for the duration of the programming cycle. The word lines in plane 1 other than the selected word line $WL_{12}$ and all word lines in the unselected other planes can be weakly driven to M, some lower voltage or allowed to float in order to reduce power that must be delivered by word line drivers that are part of word line select circuits 27 of FIG. 2.

By floating all the local bit lines other than the selected row (in this example, all but $LB_{12}$, $LBL_{22}$ and $LBL_{32}$), voltages can be loosely coupled to outer word lines of the selected plane 1 and word lines of other planes that are allowed to float through memory cells in their low resistance state (programmed) that are connected between the floating local bit lines and adjacent word lines. These outer word lines of the selected plane and word lines in unselected planes, although allowed to float, may eventually be driven up to voltage level M through a combination of programmed memory cells.

The above-described programming techniques ensure that the selected page is programmed (local bit lines at H, selected word line at 0) and that adjacent unselected word lines are at M. As mentioned earlier, other unselected word lines can be weakly driven to M or initially driven to M and then left floating. Alternately, word lines in any plane distant from the selected word line (for example, more than 5 word lines away) can also be left uncharged (at ground) or floating. This can reduce the power dissipation caused by charging a large number of word lines.

Although the above description assumes that each memory cell of the page being programmed will reach its desired ON value with one application of a programming pulse, a program-verify technique commonly used in NOR or NAND flash memory technology may alternately be used. In this process, a complete programming operation for a given page includes of a series of individual programming operations in which a smaller change in ON resistance occurs within each program operation. Interspersed between each program operation is a verify (read) operation that determines whether an individual memory cell has reached its desired programmed level of resistance or conductance consistent with the data being programmed in the memory cell. The sequence of program/verify is terminated for each memory cell as it is verified to reach the desired value of resistance or conductance. After all of memory cells being programmed are verified to have reached their desired programmed value, programming of the page of memory cells is then completed.

Figure 5:
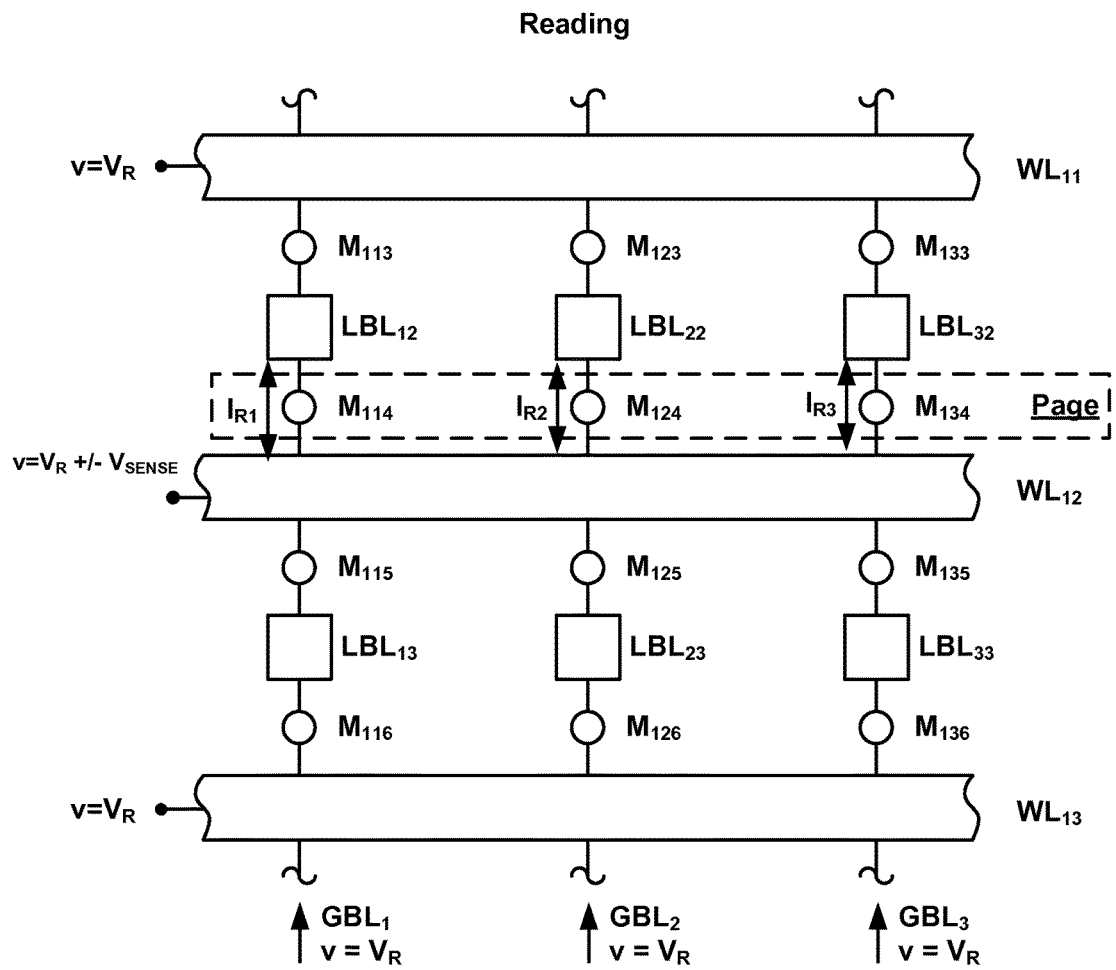
FIG. 5 is an expanded view of a portion of one of the planes of FIG. 3, annotated to show effects of reading data therefrom.

With reference primarily to FIG. 5, the parallel reading of the states of a page of memory cells, such as the memory cells $M_{114}$, $M_{124}$ and $M_{134}$, is described. The steps of an example reading process are as follows:

1. Set all the global bit lines GBLs and all the word lines WL to a voltage $V_R$. The voltage $V_R$ is simply a convenient reference voltage and can be any number of values but will typically be between 0 and 1 volt. In general, for operating modes where repeated reads occur, it is convenient to set all word lines in the array to $V_R$, even though this requires charging all the word lines. However, as an alternative, it is only necessary to raise the selected word line ($WL_{12}$ in FIG. 5), the word line in each of the other planes that is in the same position as the selected word line and the immediately adjacent word lines in all planes to $V_R$.

2. Turn ON one row of select devices by placing a voltage on the control line adjacent to the selected word line to define the page to be read. In the example of FIGS. 1 and 5, a voltage is applied to the row select line $SG_2$ to turn on the select devices $Q_{12}$, $Q_{22}$ and $Q_{32}$. This connects one row of local bit lines $LBL_{12}$, $LBL_{22}$ and $LBL_{32}$ to their respective global bit lines $GBL_1$, $GBL_2$ and $GBL_3$. These local bit lines are then connected to individual sense amplifiers (SA) that are present in data input-output circuits 21 of FIG. 2, and assume the potential $V_R$ of the global bit lines to which they are connected. All other local bit lines LBLs are allowed to float.

3. Set the selected word line ($WL_{12}$) to a voltage of $V_R \pm V_{sense}$. The sign of Vsense is chosen based on the sense amplifier and has a magnitude of about 0.5 volt. The voltages on all other word lines remain the same.

4. Sense current flowing into ($V_R$+Vsense) or out of ($V_R$−Vsense) each sense amplifier for time T. These are the currents $I_{R1}$, $I_{R2}$ and $I_{R3}$ shown to be flowing through the addressed memory cells of the example of FIG. 5, which are proportional to the programmed states of the respective memory cells $M_{114}$, $M_{124}$ and $M_{134}$. The states of the memory cells $M_{114}$, $M_{124}$ and $M_{134}$ are then given by binary outputs of the sense amplifiers within data input-output circuits 21 that are connected to the respective global bit lines $GBL_1$, $GBL_2$ and $GBL_3$. These sense amplifier outputs are then sent over lines 23 (FIG. 2) to controller 25, which then provides the read data to host system 31.

5. Turn OFF the select devices ($Q_{12}$, $Q_{22}$ and $Q_{32}$) by removing the voltage from the row select line ($SG_2$) to disconnect the local bit lines from the global bit lines, and return the selected word line ($WL_{12}$) to the voltage $V_R$.

As in the programming case, all of the local bit lines except the selected row ($LBL_{12}$, $LBL_{22}$ and $LBL_{32}$ in the example of FIG. 5) are floating. But the potential of the floating local bit lines may be driven to $V_R$ by any memory cell that is in its programmed (low resistance) state and connected between a floating local bit line and a word line at $V_R$, in any plane.

Although the neighboring word lines should be at $V_R$, as in the programming case it may be desirable to weakly drive these word lines or even allow them to float. In one variation, the selected word line and the neighboring word lines can be pre-charged to $V_R$ and then allowed to float. When the sense amplifier is energized, it may charge them to $V_R$ so that the potential on these lines is accurately set by the reference voltage from the sense amplifier (as opposed to the reference voltage from the word line driver). This can occur before the selected word line is changed to $V_R \pm V$sense but the sense amplifier current is not measured until this charging transient is completed.

The material used for the non-volatile memory cells $M_{zxy}$ in the array of FIG. 1 can be a chalcogenide, a metal oxide (MeOx), solid electrolytes, phase-change materials, carbon films, carbon nanotubes, or any one of a number of materials that exhibit a stable, reversible shift in resistance in response to an external voltage applied to or current passed through the material. Examples metal oxides include TiOx, HfOx, ZrOx, WOx, NiOx, CoOx, CoalOx, MnOx, $ZnMn_2O_4$, ZnOx, TaOx, NbOx, HfSiOx, HfAlOx. Examples of solid electrolytes include TaO, GeSe or GeS. Example phase-change materials include chalcogenide glasses, often of a composition $Ge_xSb_yTe_z$, where preferably x=2, y=2 and z=5. GeSb has also been found to be useful. Other materials include AgInSbTe, GeTe, GaSb, BaSbTe, InSbTe and various other combinations of these basic elements.

For simplicity the above description has consider the simplest case of storing one data value within each cell: each cell is either reset or set and holds one bit of data. However, the techniques of this technology are not limited to this simple case. By using various values of ON resistance and designing the sense amplifiers to be able to discriminate between several of such values, each memory cell can hold multiple-bits of data in a multiple-level cell (MLC).

Figure 6:
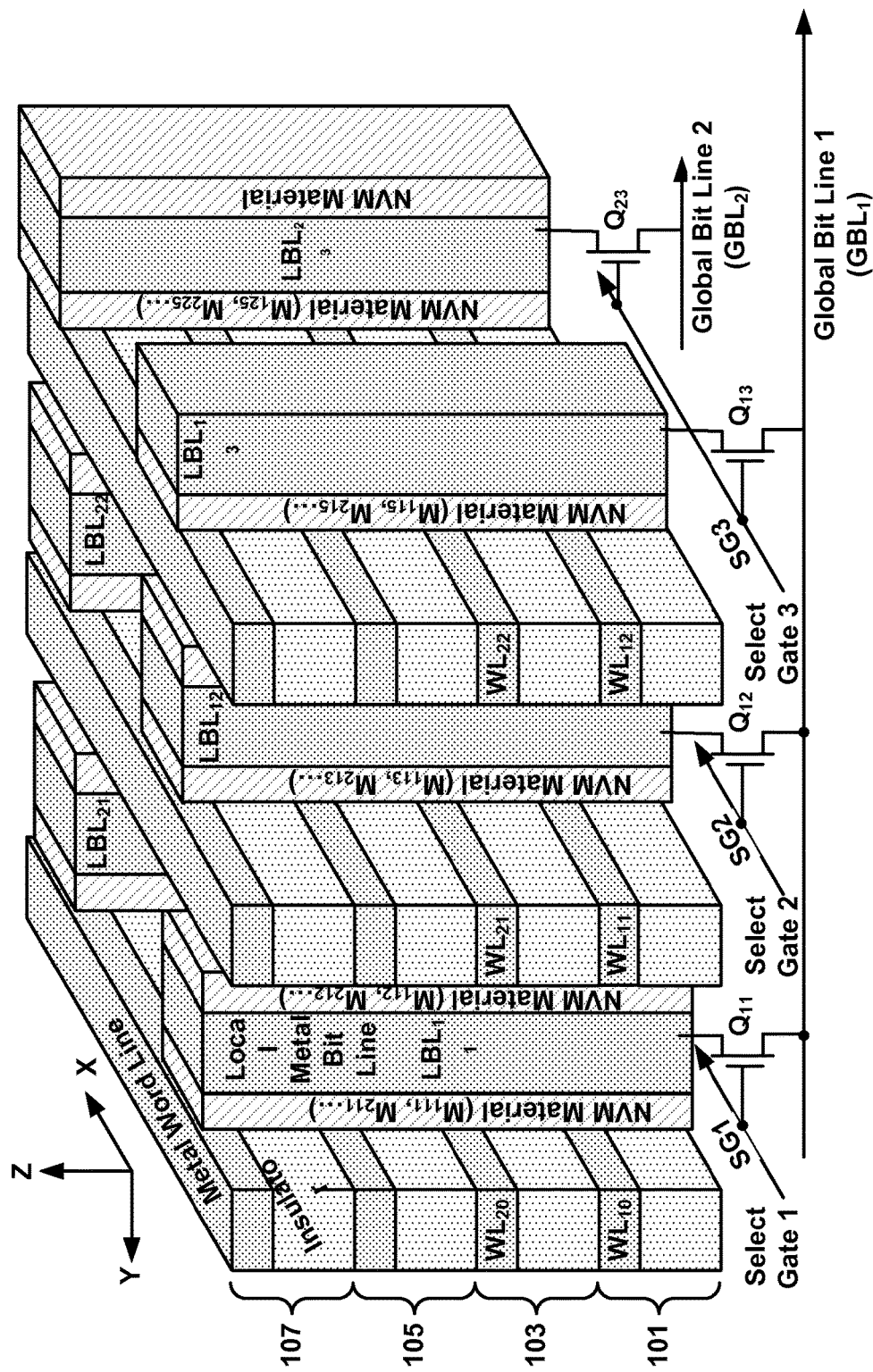
FIG. 6 is an isometric view of a portion of the three-dimensional array shown in FIG. 1 according to a first specific example of an implementation thereof.

One example semiconductor structure for implementing 3D memory array 10 of FIG. 1 is illustrated in FIG. 6, which is configured for use of non-volatile memory (NVM) material that is non-conductive when first deposited. A metal oxide of the type discussed above has this characteristic. Because the material is initially non-conductive, there is no necessity to isolate the memory cells at the cross-points of the word and bit lines from each other.

Several memory cells may be implemented by a single continuous layer of material, which in the case of FIG. 6 are strips of NVM material oriented vertically along opposite sides of the vertical bit lines in the y-direction and extending upwards through all the planes. A significant advantage of the structure of FIG. 6 is that all word lines and strips of insulation under them in a group of planes may be defined simultaneously by use of a single mask, thus greatly simplifying the manufacturing process.

Referring to FIG. 6, a small part of four planes 101, 103, 105 and 107 of the three-dimensional array are shown. Elements of the FIG. 6 array that correspond to those of the equivalent circuit of FIG. 1 are identified by the same reference numbers. FIG. 6 shows the two planes 1 and 2 of FIG. 1, plus two additional planes on top of them. All of the planes have the same horizontal pattern of conductor, dielectric and NVM material.

In each plane, metal word lines (WL) are elongated in the x-direction and spaced apart in the y-direction. Each plane includes a layer of insulating dielectric that isolates its word lines from the word lines of the plane below it or, in the case of plane 101, of the substrate circuit components below it. Extending through each plane is a collection of metal local bit line (LBL) "pillars" elongated in the vertical z-direction and forming a regular array in the x-y direction.

Each bit line pillar is connected to one of a set of global bit lines (GBL) in the silicon substrate running in the y-direction at the same pitch as the pillar spacing through the select devices ($Q_{xy}$) formed in the substrate whose gates are driven by the row select lines (SG) elongated in the x-direction, which are also formed in the substrate. The select devices $Q_{xy}$ may be conventional CMOS transistors (or vertical MOSFET thin film transistors, or Junction FET, or npn transistors) and fabricated using the same process as used to form the other conventional circuitry.

In the case of using npn transistors instead of MOS transistors, the row select line (SG) lines are replaced with the base contact electrode lines elongated in the x-direction. Also fabricated in the substrate but not shown in FIG. 6 are sense amplifiers, input-output (I/O) circuitry, control circuitry, and any other necessary peripheral circuitry. There is one row select line (SG) for each row of local bit line pillars in the x-direction and one select device (Q) for each individual local bit line (LBL).

Each vertical strip of NVM material is sandwiched between the vertical local bit lines (LBL) and a plurality of word lines (WL) vertically stacked in all the planes. Preferably the NVM material is present between the local bit lines (LBL) in the x-direction. A memory storage element (M) is located at each intersection of a word line (WL) and a local bit line (LBL). In the case of a metal oxide described above for the memory storage element material, a small region of the NVM material between an intersecting local bit line (LBL) and word line (WL) is controllably alternated between conductive (set) and non-conductive (reset) states by appropriate voltages applied to the intersecting lines. In one embodiment, the NVM material includes hafnium oxide, the word lines comprise TiN, and the bit lines comprise N+ silicon.

There also may be a parasitic NVM element formed between the LBL and the dielectric between planes. By choosing the thickness of the dielectric strips to be large compared to the thickness of the NVM material layer (that is, the spacing between the local bit lines and the word lines), a field caused by differing voltages between word lines in the same vertical word line stack can be made small enough so that the parasitic element never conducts a significant amount of current. Similarly, in other embodiments, the non-conducting NVM material may be left in place between adjacent local bit lines if the operating voltages between the adjacent LBLs remain below the programming threshold.

An outline of a process for fabricating the structure of FIG. 6 is as follows:

1. The support circuitry, including the select devices Q, global bit lines GBL, row select lines SG and other circuits peripheral to the array, is formed in the silicon substrate in a conventional fashion and the top surface of this circuitry is planarized, such as by etching with use of a layer of etch stop material placed over the circuitry.
2. Alternating layers of dielectric (insulator) and metal are formed as sheets on top of each other and over at least the area of the substrate in which the select devices Q are formed. In the example of FIG. 6, four such sheets are formed.
3. These sheets are then etched (isolated) by using a mask formed over the top of them that has slits elongated in the x-direction and spaced apart in the y-direction. All of the material is removed down to the etch stop to form the trenches shown in FIG. 6 in which the local bit line (LBL) pillars and NVM material is later formed. Contact holes are also etched through the etch stop material layer at the bottom of the trenches to allow access to the drains of the select devices Q at the positions of the subsequently formed pillars. The formation of the trenches also defines the width in the y-direction of the word lines (WL).
4. NVM material is deposited in thin layers along the sidewalls of these trenches and across the structure above the trenches. This leaves the NVM material along the opposing sidewalls of each of the trenches and in contact with the word line (WL) surfaces that are exposed into the trenches.
5. Doped poly silicon (or suitable metallic electrode material) is then deposited in these trenches in order to make contact with the NVM material. The deposited material is patterned using a mask with slits in the y-direction. Removal of the deposited material by etching through this mask leaves the local bit line (LBL) pillars. The NVM material in the x-direction may also be removed between pillars. The space between pillars in the x-direction is then filled with a dielectric material and planarized back to the top of the structure.

A significant advantage of the configuration of FIG. 6 is that only one etching operation through a single mask is required to form the trenches through all the layers of material of the planes at one time. However, process limitations may limit the number of planes that can be etched together in this manner. If the total thickness of all the layers is too great, the trench may need to be formed in sequential steps. A first number of layers are etched and, after a second number of layers have been formed on top of the first number of trenched layers, the top layers are subjected to a second etching step to form trenches in them that are aligned with the trenches in the bottom layers. This sequence may be repeated even more times for an implementation having a very large number of layers.

In some memory arrays, a separate word line driver is used to set the voltage level of each word line in the memory array. In other memory arrays, to minimize the number of required word line drivers, each word line driver may be connected to a group of multiple word lines connected together, where a memory system will have many of such groups.

In one example implementation, 16 (or another number of) word lines will be connected together, and the connected group of word lines will be connected to a single word line driver. In one example, the 16 word lines are connected together to form a comb shape. However, other shapes can also be used. Using one word line driver to drive 16 (or a different number of) word lines in a single comb (or other shaped structure) reduces the number of word line drivers. As a result, the word line drivers can fit underneath the memory array.

The use of the vertically oriented select devices described above also provides more room underneath the memory array (e.g., in the substrate) to implement the word line drivers. Additionally, using one or more word line drivers to drive multiple word lines reduces the number of wires needed from the word line drivers to the word lines, thereby saving room, simplifying routing, reducing power and reducing the chance of a fault. Additionally, because the word lines and bit lines are now shorter, there is a smaller time constant than in previous designs. Because there is a smaller time constant, the lines will settle quicker and there is no significant transient effect that will cause a disturb for unselected memory cells.

Figure 7:
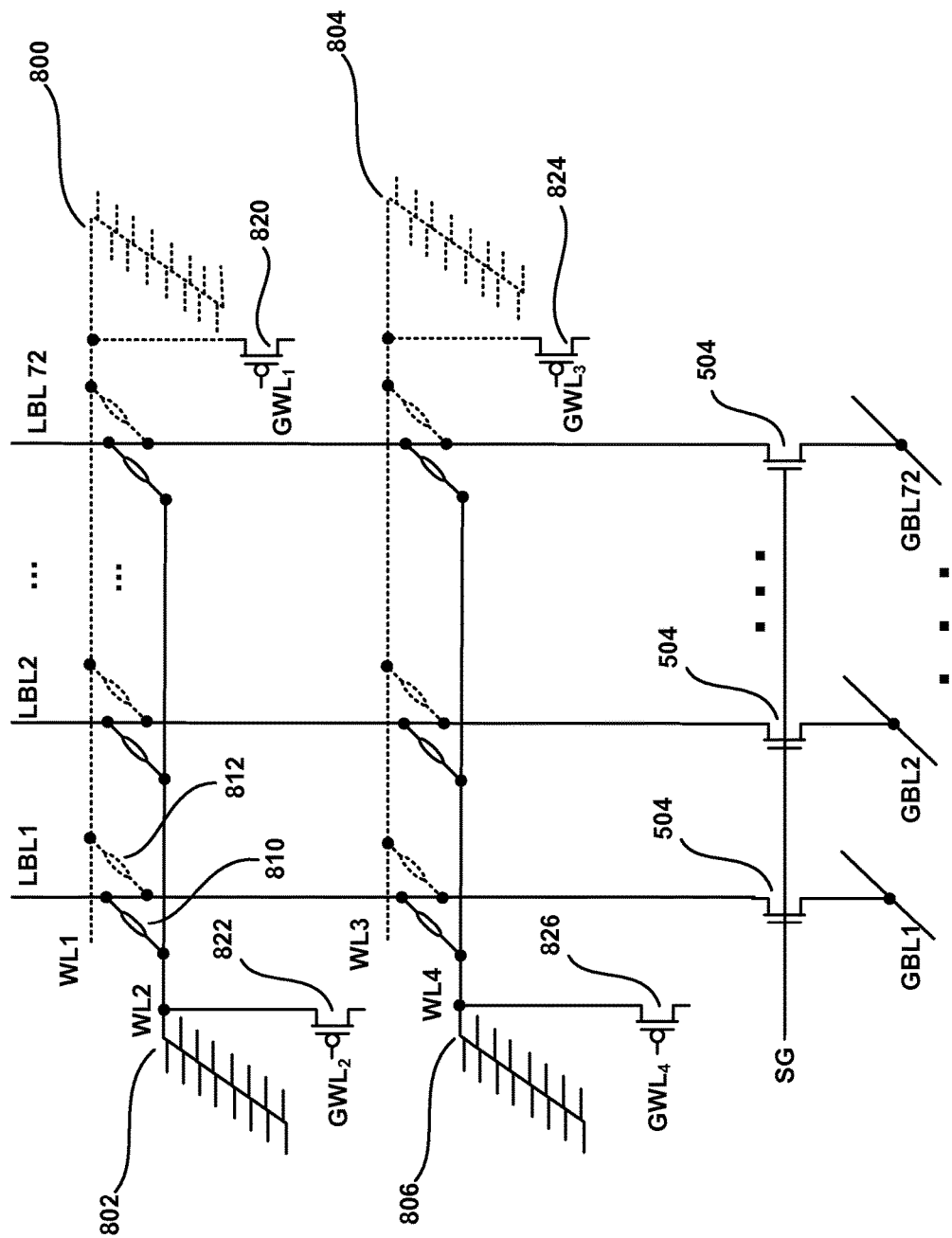
FIG. 7 is a schematic of a portion of the memory system, depicting vertical bit lines, select devices and word line combs (connected word lines).

FIG. 7 is a partial schematic depicting a portion of a memory system which uses the comb structure described above. For example, FIG. 7 shows combs 800, 802, 804 and 806. A memory system is likely to have many more combs than depicted in FIG. 7. FIG. 7 show fours combs to make it easier to read. Each comb includes 16 word lines, also referred to as word line fingers. For each comb, a first set such as eight (e.g., half) of the word line fingers are on a first side of the comb and are in a first block while another set such as eight (e.g., half) of the word line fingers are on the second side of the comb and are in a second block that is next to the first block.

FIG. 7 shows that combs 800 and 802 (and all of the attached word line fingers) are in a first plane or level of the memory array, and combs 804 and 806 (and all of the attached word line fingers) are on a second plane or level of the memory array. Each of the combs has a signal line to one word line driver. For example, word line comb 800 is connected to word line driver 820. When word line comb 800 is selected, all of the word line fingers connected to word line comb 800 are selected (e.g., receive the selected word line signal).

Word line comb 802 is connected to word line driver 822. Word line comb 804 is connected to word line driver 824. Word line comb 806 is connected to word line driver 826. Word line drivers 820, 822, 824 and 826 are implemented underneath the memory array in the substrate. In one embodiment, a word line driver is located underneath the block (or one of the blocks) to which it is connected.

FIG. 7 shows that word line comb 800 includes word line WL1 which is connected to memory cells that are connected to local bit lines LB1, LB2, . . . LB72 (72 local bit lines). Word line combs 802, 804 and 806 include word lines WL2, WL3 and WL4, respectively, that each are connected to memory cells that are also connected to the same 72 local bit lines LBL1, LBL2, . . . LBL72. In this arrangement, word line combs 800 and 804 are on one side of the memory array and word line combs 802 and 806 are on the opposite side of the memory array such that the word line fingers from comb 800 are interleaved with the word line fingers of word line comb 802, and word line fingers from comb 804 are interleaved with the word line fingers of word line comb 806. To make it easier to read, word line combs 800, 804, and their word line fingers appear as dotted lines to show that they are from the right side of the memory array, whereas word line combs 802, 806 are solid lines to show that they are from the left side of the memory array.

In this arrangement, each memory cell connected to a word line of word line comb 802 for the block being depicted will have a corresponding memory cell connected to a word line for word line comb 800 that connects to the same local bit line. For example, memory cell 810 (connected to WL2) and memory cell 812 (connected to WL1) are both connected to LBL1. Therefore, the system has to be operated such that if LBL1 is selected, only appropriate memory cell 810 or 812 should be selected. Note that the local bit lines are connected to the appropriate global bit lines by select devices 504.

Figure 8:
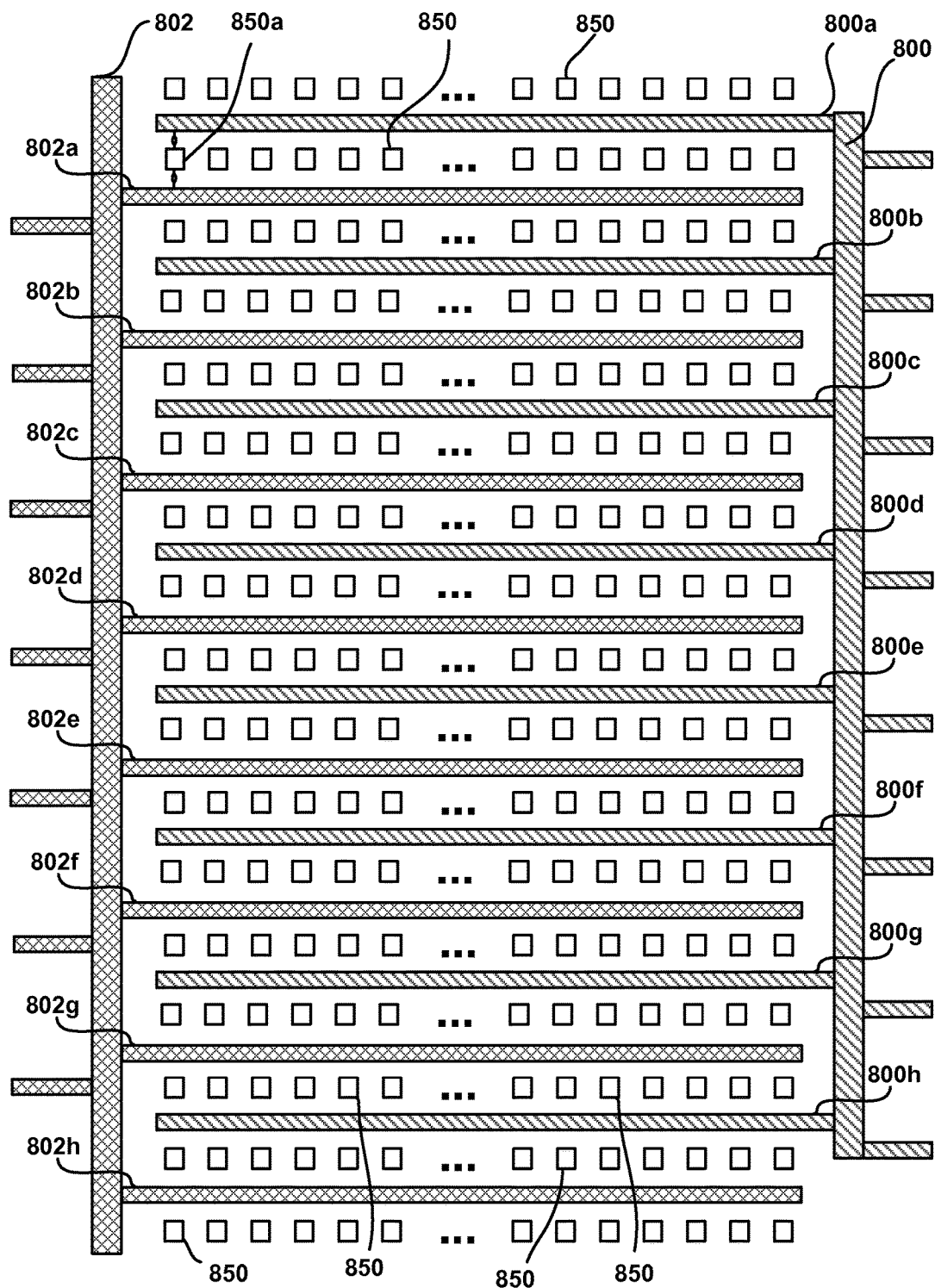
FIG. 8 is a top view of two word line combs and multiple vertical bit lines.

FIG. 8 is a top view of one layer of the memory array depicting part of two word line combs 800 and 802. As described above, each word line comb has word line fingers on two sides of its spine. FIG. 8 only shows the word line fingers on one side of each spine (with stubs being depicted for the word line fingers on the other side of the spine). For example, word line comb 800 includes word line fingers 800*a*, 800*b*, 800*c*, 800*d*, 800*e*, 800*f*, 800*g* and 800*h*, and word line comb 802 includes word line fingers 802*a*, 802*b*, 802*c*, 802*d*, 802*e*, 802*f*, 802*g* and 802*h*.

Between adjacent word line fingers from word line combs 802 and 800 (which are interleaved as describe above), are vertical bit lines 850 (note that only a subset of vertical bit lines are labeled with reference number 850 to make the drawing easy to read). At the edge of the word line comb, the row of vertical bit lines is shared with an adjacent word line comb. Between each vertical bit line and each word line finger is a memory cell. To make the drawing easy to read, memory cells are only depicted for local bit line 850*a*.

Because two word line comb structures are interleaved and share local bit lines, biasing memory cells connected to one of the word line combs (and not the other) will have an effect on the other word line comb. Biasing the vertical bit lines will have an effect on all memory cells (for any word line comb) connected to those bit lines, even though the respective word line combs are not biased. Biasing a word line comb will bias all 16 (or other number of) word line fingers that are part of that word line comb.

Figure 9:
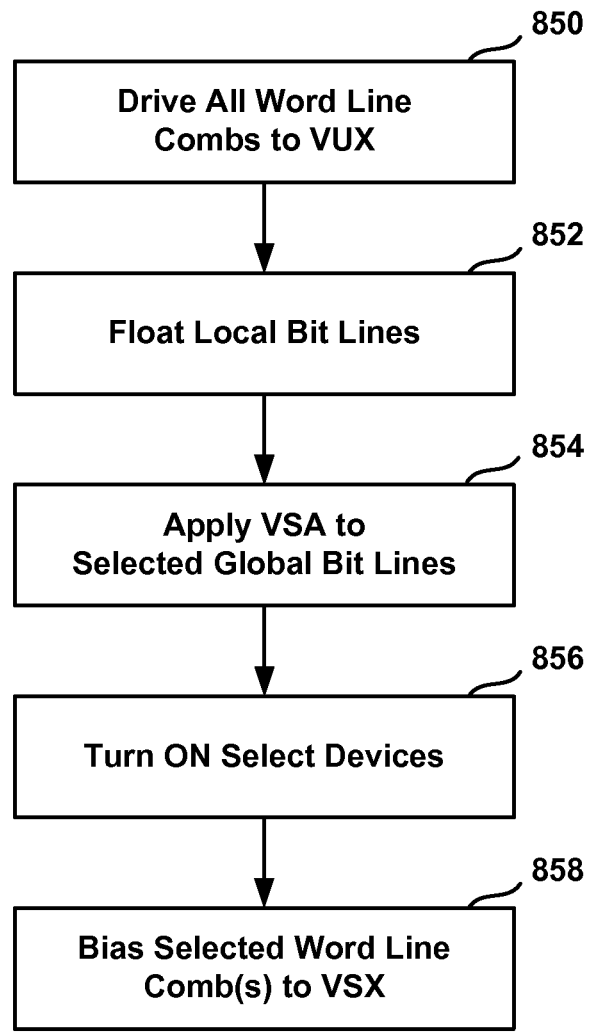
FIG. 9 is a flowchart describing an embodiment of a process programming memory cells.

FIG. 9 is a flow chart describing an embodiment of a process for programming memory cells. The process of FIG. 9 can be performed as part of a SET process or as part of a RESET process. In Step 850, all word line combs are driven to an unselected word line voltage VUX. In some embodiments, VUX may be approximately 1.3 V, although other VUX values may be used.

In step 852, the local bit lines are all floated, and therefore they will drift to or near VUX. In step 854, a selected bit line voltage VSA is applied to selected global bit lines. In some embodiments, VSA may be approximately 4.4 V, although other VSA values may be used.

In step 856, the select devices are turned ON to connect the local bit lines to the global bit lines. Accordingly, the selected local bit lines will rise to or toward VSA. In step 858, the selected word line comb is biased at a selected word line voltage VSX. In some embodiments, VSX may be approximately 0 V, although other VSX values may be used. In some embodiments more than one word line comb can be pulled down to VSX. In other embodiments, only one word line comb can be selected at a time.

Figure 10:
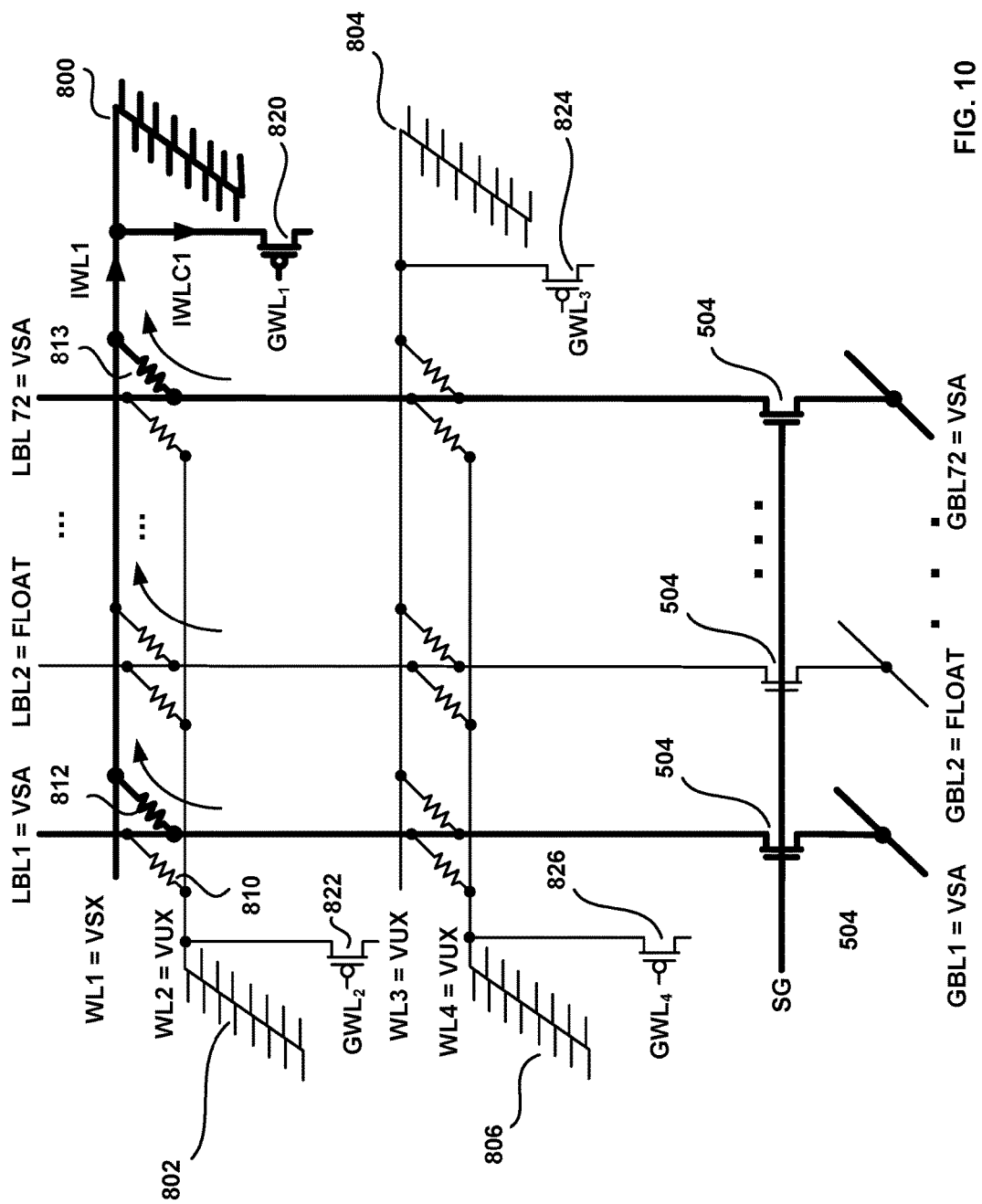
FIG. 10 is a schematic of a portion of the memory system, depicting vertical bit lines, select devices and word line combs.

FIG. 10 illustrates the portion of the memory system of FIG. 7 during a programming operation of memory cell 812, which is coupled between word line WL1 and local bit line LB1, and memory cell 813, which is coupled between word line WL1 and local bit line LB72. In accordance with the method of FIG. 9, word line combs 800, 802, 804 and 806 are driven to unselected word line voltage VUX (e.g., 1.3 V). Next, local bit lines LB1, LB2, . . . , LB72 are all floated, and therefore they will drift to or near VUX. The selected bit line voltage VSA (e.g., 4.4 V) is applied to the selected global bit lines GBL1 and GBL72, and select device SG is turned ON to connect the local bit lines LB1, LB2, . . . , LB72 to global bit lines GBL1, GBL2, . . . , GBL72. Accordingly, selected local bit lines LB1 and LB72 each rise to or toward VSA. Finally, selected word line comb 800 is biased at the selected word line voltage VSX (e.g., 0 V).

As a result of the voltage differences across the memory cells in the memory array, each memory cell coupled to selected word line comb 800 conducts current, which sum to form a total word line comb current IWLC1. In addition, each memory cell coupled to selected word line WL1 conducts current, which sum to form a total selected word line current IWL1. Because the resistance of memory cells in the memory array vary based on the data values stored in the memory cells, the currents conducted by the memory cells, and hence IWLC and IWLC1 vary based on the data values stored in the memory cells coupled to the selected word line comb and the selected word line, respectively. Further, because conductors feeding a selected word line comb, and the individual word line fingers on a word line comb each local have a non-zero resistance, voltage drops along word line combs and along word lines vary based on the data values stored in the memory cells coupled to the selected word line comb and the selected word line.

Figure 11A:
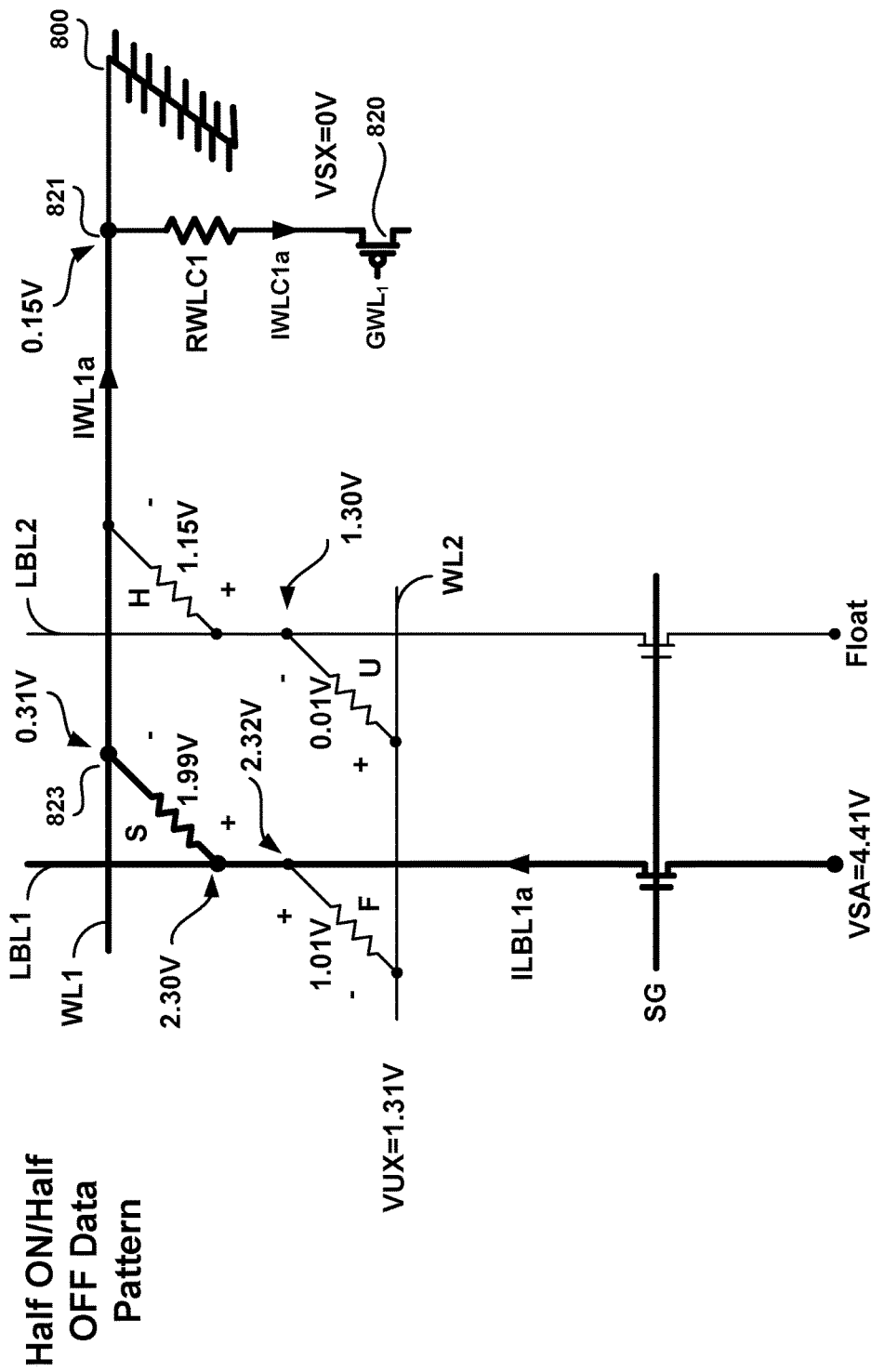
FIGS. 11A-11B are schematics of a portion of the memory system, depicting vertical bit lines, select devices and word line combs.

For example, FIG. 11A depicts a portion of a memory array in which the data pattern of memory cells coupled to selected word line comb 800 is half ON/half OFF. In other words, half of the memory cells are ON (low resistance) and half are OFF (high resistance). Selected word line comb driver circuitry has an equivalent resistance represented by resistor RWLC1. Selected local bit line LBL1 conducts a current ILBL1*a*, selected word line WL1 conducts a total word line current IWL1*a* and selected word line comb driver circuitry conducts a total word line comb current IWLC1*a*.

Ideally, the voltage of all word lines of selected word line comb 800 and all points along the word lines are at VSX=0 V. However, as a result of a voltage drop across resistor RWLC1, the voltage at end 821 of selected word line WL1 is 150 mV. In addition, as a result of voltage drops along selected word line WL1, the voltage at end 823 of selected word line WL1 is 310 mV.

Figure 11B:
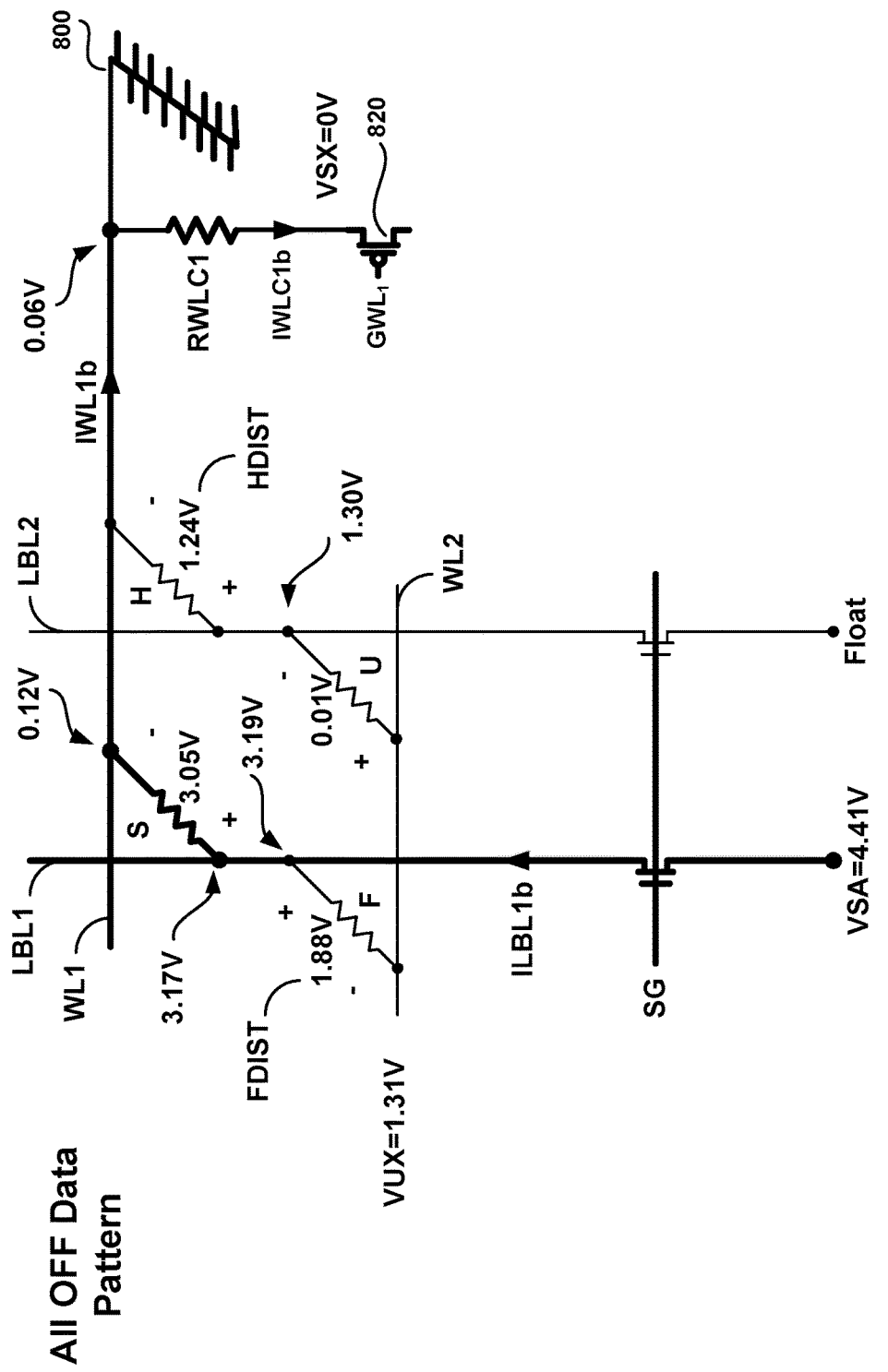

FIG. 11B, depicts the same portion of the memory array depicted in FIG. 11A, but the data pattern of memory cells coupled to selected word line comb 800 is all OFF (high resistance). Selected local bit line LBL1 conducts a current ILBL1*b*, selected word line WL1 conducts a total word line current IWL1*b* and selected word line comb driver circuitry conducts a total word line comb current IWLC1*b*. As a result of a voltage drop across the word line comb (e.g., a voltage drop across resistor RWLC1), the voltage at end 821 of selected word line WL1 is 60 mV. In addition, as a result of voltage drops along selected word line WL1, the voltage at end 823 of selected word line WL1 is 120 mV.

Thus, as a result of the difference in data patterns between the embodiments of FIGS. 11A and 11B, IWL1*a*>IWL1*b* and IWLC1*a*>IWLC1*b*. Thus voltage drops on the selected word line comb and along the selected word line WL1 vary based on the data patterns of memory cells coupled to selected word line comb 800.

As depicted in FIGS. 11A and 11B, memory cells coupled between a selected local bit line (e.g., LBL1) and a selected word line (e.g., WL1) are labeled "S," memory cells coupled between a selected local bit line (e.g., LBL1) and an unelected word line (e.g., WL2) are labeled "F," memory cells coupled between an unselected local bit line (e.g., LBL2) and a selected word line (e.g., WL1) are labeled "H,"

and memory cells coupled between an unselected local bit line (e.g., LBL2) and an unselected word line (e.g., WL2) are labeled "U."

Thus, as shown in FIGS. 11A and 11B, example voltage drops across the S, F, H and U memory cells are:

| FIG. 11A Half ON/Half OFF Data Pattern | | FIG. 11B All OFF Data Pattern | |
|---|---|---|---|
| Memory cell | Voltage Drop | Memory cell | Voltage Drop |
| S | 1.99 V | S | 3.05 V |
| F | 1.01 V | F | 1.88 V |
| H | 1.15 V | H | 1.24 V |
| U | 0.01 V | U | 0.01 V |

The voltage drops across unselected memory cells are referred to herein as "Disturb Voltages." Thus, in FIG. 11A, the F Disturb Voltage is 1.01 V and the H Disturb Voltage is 1.15 V. In FIG. 11B, the F Disturb Voltage is 1.88 V and the H Disturb Voltage is 1.24 V. The U Disturb Voltage is 0.01 V in both embodiments, and is insignificant. If the programming voltage for memory cells in the memory array is approximately 2 V, F memory cells in FIG. 11B have disturb voltages that are very close to the programming voltage, and hence may be inadvertently programmed.

Figures 12A, 12B:
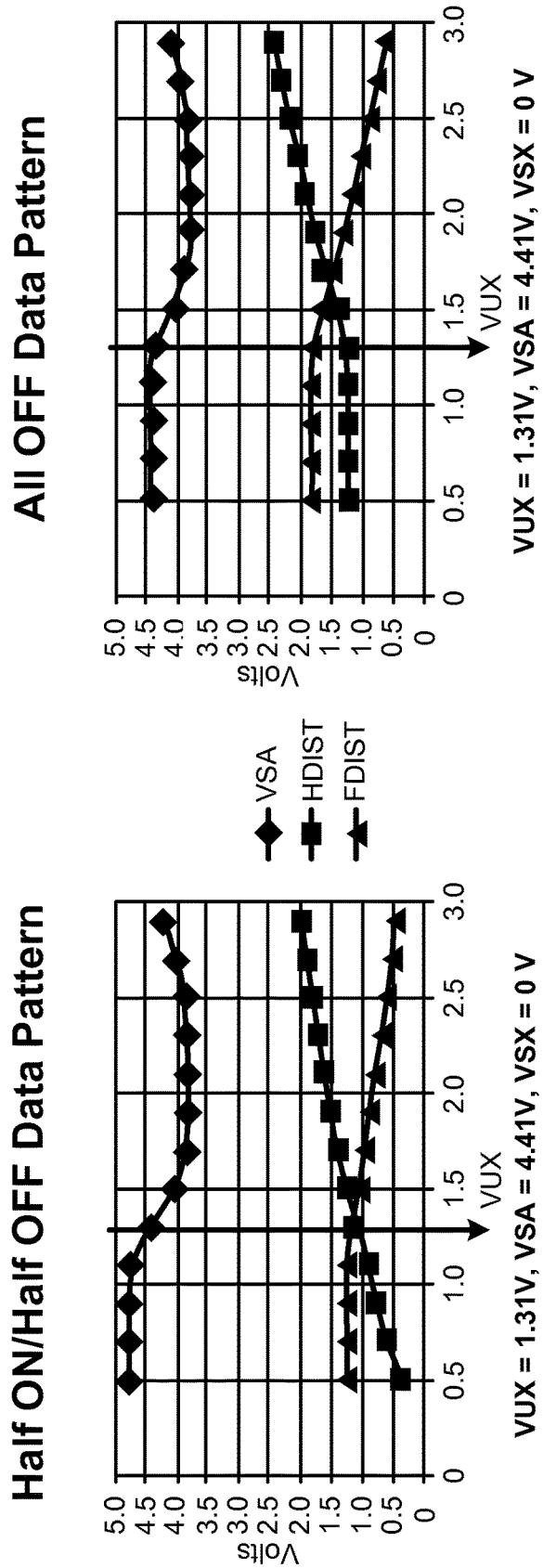
FIGS. 12A-12B are diagrams of biasing voltages for two different data patterns.

FIG. 12A depicts a graph of unselected word line voltage VUX, selected bit line voltage VSA, H Disturb Voltage and F Disturb Voltage for a fixed value of selected word line voltage VSX=0 V for a memory array with a half-ON/half-OFF data pattern, such as the portion of the memory array depicted in FIG. 11A. The data values used for the graph may be obtained from a simulation program. The VSA values in the graph are the minimum VSA values needed to program a selected S memory cell at each corresponding VUX value, with VSX=0 V.

The H Dist and F Dist values are the maximum H Disturb Voltage and F Disturb Voltage for the corresponding VSA and VUX values, with VSX=0 V. As can be seen in FIG. 12A, for values VUX=1.31, VSA=4.41 V and VSX=0 V, the H and F Disturb Voltages are approximately balanced, with the F Disturb Voltage=1.01 V and the H Disturb Voltage=1.15 V.

As shown in FIG. 12B, however, if the same VUX=1.31, VSA=4.41 V and VSX=0 V values are used for a memory array with an all OFF data pattern, such as the portion of the memory array depicted in FIG. 11B, the H and F Disturb Voltages are no longer balanced, with the F Disturb Voltage=1.88 V and the H Disturb Voltage=1.24 V. As a result, F cells are susceptible to being unintentionally programmed. Thus, using fixed values of unselected word line voltage VUX, selected bit line voltage VSA and selected word line voltage VSX for all data patterns may result in increased write disturbs. Although the example of FIGS. 11A-11B and 12A-12B pertain to write (SET/RESET) operations, similar problems may arise for reading operations.

In an embodiment, prior to performing a write operation, a first calibration process is performed to compensate for the voltage drop on the selected word line comb based on an estimate of the data pattern of memory cells coupled to selected word line comb. In particular, the first calibration process estimates the ON/OFF data pattern in a selected word line comb. The estimated ON/OFF data pattern is then be used as an index to a first table of predetermined unselected word line voltage VUX and selected bit line voltage VSA values for a fixed selected word line voltage VSX that satisfy a first predetermined condition. For example, the first predetermined condition may be balanced H Disturb and F Disturb Voltages during a write (SET/RESET) operation.

Figure 13:
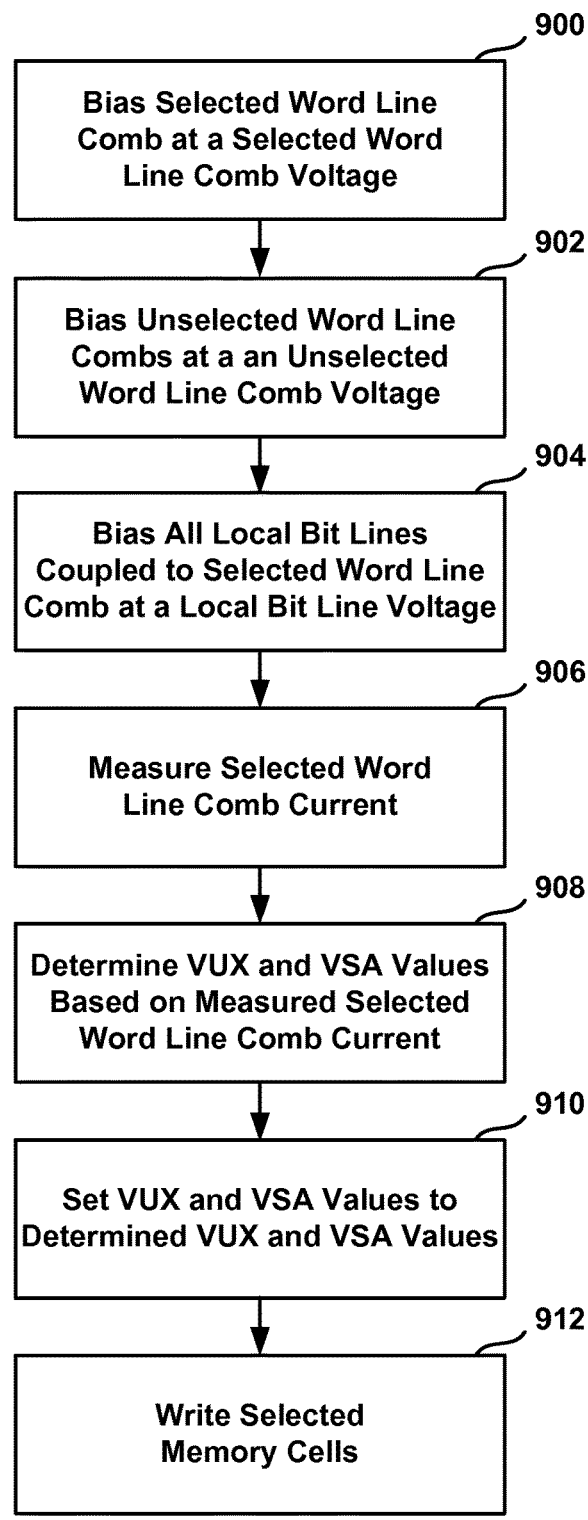
FIG. 13 is a flowchart describing an embodiment of a process for performing a word line comb calibration.

FIG. 13 depicts a flow diagram of an example first calibration process based on estimating a data pattern of memory cells coupled to a selected word line comb, and setting unselected word line voltage VUX and selected bit line voltage VSA values based on the estimated data patterns. In one embodiment, the process of FIG. 13 may be performed by a memory system or by a memory controller, such as controller 25 in FIG. 2.

In step 900, a selected word line comb is biased to a selected word line comb voltage. For example, the selected word line comb voltage may be 1 V, although other voltages may be used.

In step 902, all unselected word line combs are biased to an unselected word line comb voltage. For example, the unselected word line comb voltage may be 0.5 V, although other voltages may be used.

In step 904, all local bit lines coupled to the selected word line comb are biased to a local bit line voltage. For example, the local bit line voltage may be 0.5 V, although other voltages may be used.

In step 906, a current conducted by the selected word line comb is measured. For example, in an embodiment, the selected word line comb voltage may be set to 1 V and the unselected word line comb voltage may be set to 0.5 V. The local bit lines coupled to the selected word line comb may be coupled to VUB driver circuit with VUB=0.5 V. As a result, a voltage drop of about 0.5 V appears across all memory cells coupled to the selected word line comb, and a voltage drop of about 0 V appears across all other memory cells. A current IVUB conducted by the VUB driver circuit constitutes the current flowing through the local bit lines coupled to the selected word line comb, and the current conducted by the selected word line comb. Thus, by measuring IVUB, the selected word line comb current can be determined.

In an alternative embodiment, the selected word line comb voltage may be set to 0 V, and the bit line comb voltage may be set to FLOAT (e.g., all local bit lines coupled to the selected word line comb may be allowed to float). All unselected word line combs may be coupled to a VUX driver circuit with VUX=0.5 V. As a result, the local bit lines coupled to the selected word line comb will float to 0.5 V, a voltage drop of about 0.5 V appears across all memory cells coupled to the selected word line comb, and a voltage drop of about 0 V appears across all other memory cells. A current IVUX conducted by the VUX driver circuit constitutes all the current conducted through H cells in the selected comb from unselected word lines into the selected word line. Thus, by measuring IVUX, the selected word line comb current can be determined.

In another alternative embodiment, the selected word line comb voltage may be set to 0 V, and the bit line comb voltage may be set to FLOAT (e.g., all local bit lines coupled to the selected word line comb may be allowed to float). All unselected word line combs may be coupled to a VUX driver circuit with VUX=0.5 V. As a result, the local bit lines coupled to the selected word line comb will float to 0.5 V, a voltage drop of about 0.5 V appears across all memory cells coupled to the selected word line comb, and a voltage drop of about 0 V appears across all other memory cells. A current conducted by the selected word line comb driver circuit constitutes the current by the selected word line comb. Thus, by measuring the current conducted by the selected word line comb driver circuit, the selected word line comb current can be determined.

Referring again to FIG. 13, in step 908, unselected word line voltage VUX and selected local bit line voltage VSA values are determined for a given selected word line voltage VSX based on the selected word line comb current measured in step 906. As described above, the selected word line comb current varies based on the data values of memory cells coupled to the selected word line comb. Thus, the measured selected word line comb current from step 906 may be used as an index to the data pattern stored in the memory cells coupled to the selected word line comb. Based on the estimated data pattern, values for unselected word line voltage VUX and selected local bit line voltage VSA may be determined for a given selected word line voltage VSX.

For example, for a given selected word line voltage VSX (e.g., VSX=0 V), a first table may be created (e.g., by using a circuit simulation tool that simulates a model of the memory array) that includes all possible data patterns for memory cells coupled to a selected word line comb, and corresponding unselected word line voltage VUX and selected local bit line voltage VSA values for each data pattern. The simulation may be used to determine VUX and VSA values that result in a desired goal, such as balancing H and F Disturb Voltages for all data patterns.

Figure 14:
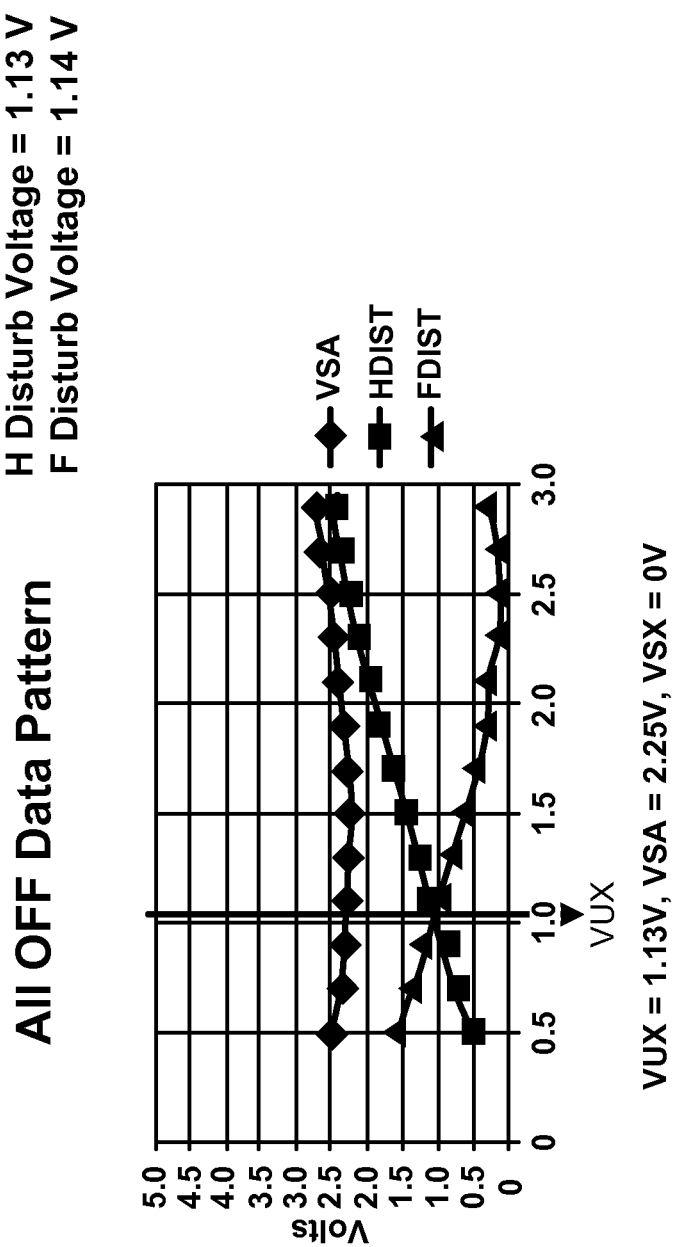
FIG. 14 is a diagram of biasing voltages determined using the process of FIG. 13.

For example, for an all OFF data pattern, the simulation may result in the chart in FIG. 14, which shows that for VUX=1.13 V, VSA=2.25 V, VSX=0 V, and the disturb voltages are substantially balanced at H Disturb Voltage=1.13 V, and F Disturb Voltage=1.14 V. Similar simulations may be performed to determine desired VUX and VSA values for each data pattern, and the results may be stored in the first table. The first table may be stored in RAM 34 of controller 25 shown in FIG. 2. The simulation tool also may be used to correlate measured selected word line comb currents to data patterns of memory cells coupled to the selected word line comb, and the selected word line comb currents may be used as an index to VUX and VSA values associated with the word line comb currents.

Thus, referring again to FIG. 13, at step 908, the measured selected word line comb current from step 906 may be used as an index to the first table, and unselected word line voltage VUX and selected local bit line voltage VSA values associated with the measured selected word line comb current may be extracted from the first table.

At step 910, the unselected word line voltage VUX and selected local bit line voltage VSA are set to the values determined in step 908. For example, controller 25 of FIG. 2 may cause word line select circuits 27 and local bit line select circuits 29 to set unselected word line voltage VUX and selected local bit line voltage VSA to the values determined in step 908.

At step 912, a write operation is performed on the selected memory cell(s).

In another embodiment, prior to performing a write operation, a second calibration process is performed to compensate for the voltage drop on the selected word line based on an estimate of the data pattern of memory cells coupled to selected word line. In particular, the second calibration process estimates the ON/OFF data pattern in a selected word line. The estimated ON/OFF data pattern may then be used as an index to a second table of predetermined unselected word line voltage VUX and selected bit line voltage VSA values for a fixed selected word line voltage VSX that satisfy a second predetermined condition. For example, the second predetermined condition may be balanced H Disturb and F Disturb Voltages during a write (SET/RESET) operation.

Figure 15:
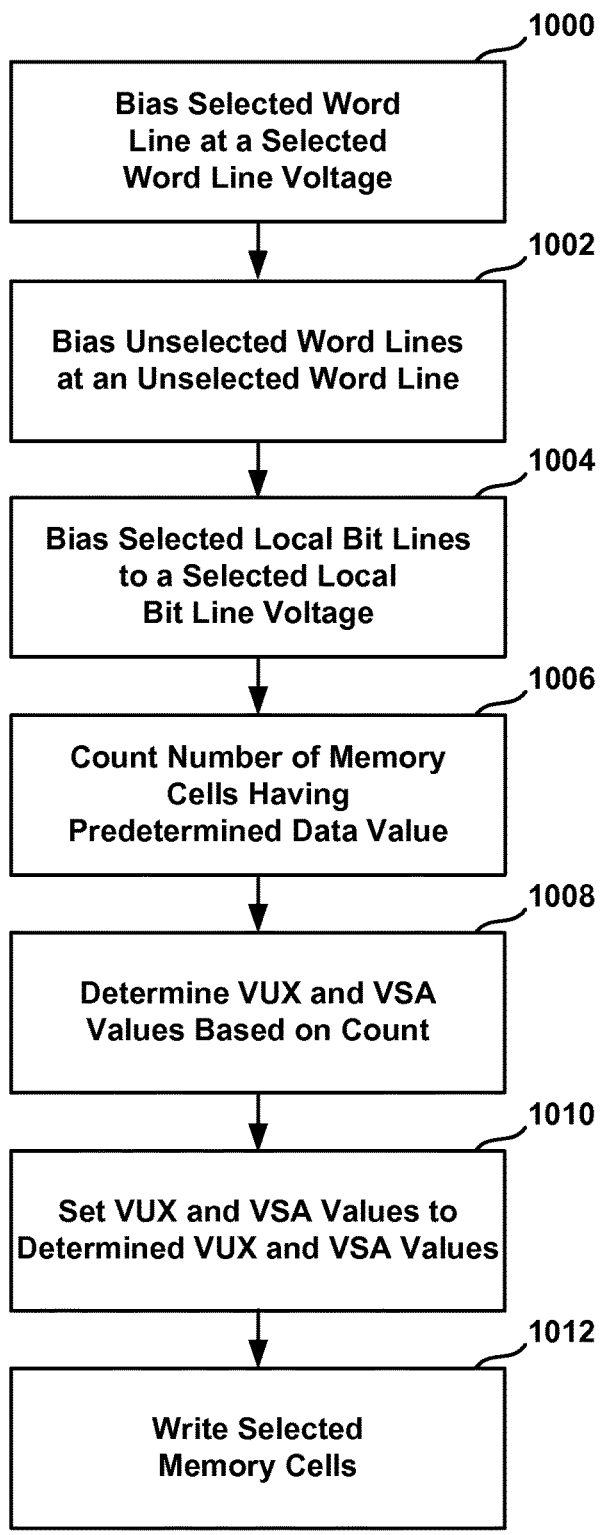
FIG. 15 is a flowchart describing an embodiment of a process for performing a word line calibration.

FIG. 15 depicts a flow diagram of an example second calibration process based on estimating a data pattern of memory cells coupled to a selected word line, and setting unselected word line voltage VUX and selected bit line voltage VSA values based on the estimated data pattern. In one embodiment, the process of FIG. 15 may be performed by a memory system or by a memory controller, such as controller 25 in FIG. 2.

In step 1000, a selected word line is biased to a selected word line voltage. For example, the selected word line voltage may be 0 V, although other voltages may be used.

In step 1002, all unselected word lines are biased to an unselected word line voltage. For example, the unselected word line voltage may be 1 V, although other voltages may be used.

In step 1004, the local bit lines coupled to the selected word line are biased to a selected local bit line voltage. For example, the selected local bit line voltage may be 1 V, although other voltages may be used.

In step 1006, a count is determined of a number of memory cells on the selected word line that have a predetermined data value. For example, for memory cells having two data states, the predetermined data value may be data "0" or "1."

In an embodiment, if the predetermined data value is "0," the second calibration process may be performed during a read-before-write operation, and the count of memory cells having a data state of "0" may be determined from the outputs of the sense amplifiers coupled to the local bit lines. For example, the sense amplifier outputs may be coupled to a current-to-voltage converter, the output of the current-to-voltage converter may be compared to reference voltages that correspond to the number of "0" counts in the memory cells on the selected word line. Alternatively, the count can be performed by controller 25 in FIG. 2. In another embodiment, logic circuits can be included near sense amplifiers to perform the count of "0" state memory cells.

In step 1008, unselected word line voltage VUX and selected local bit line voltage VSA values are determined for a given selected word line voltage VSX based on the count determined in step 906. As described above, the selected word line current varies based on the data values of memory cells coupled to the selected word line. Thus, the determined count for the selected word line from step 1006 may be used as an estimate of the data pattern stored in the memory cells coupled to the selected word line. Based on the estimated data pattern, values for unselected word line voltage VUX and selected local bit line voltage VSA may be determined for a given selected word line voltage VSX.

For example, for a given selected word line voltage VSX (e.g., VSX=0 V), a second table may be created (e.g., by using a circuit simulation tool that simulates a model of the memory array) that includes all possible counts of predetermined data values for memory cells coupled to a selected word line, and corresponding unselected word line voltage VUX and selected local bit line voltage VSA values for each data pattern. The simulation may be used to determine VUX and VSA values that result in a desired goal, such as balancing H and F Disturb Voltages for all data patterns.

For example, for a count of all 0s, the simulation may result in the chart in FIG. 14, which shows that for VUX=1.13 V, VSA=2.25 V, VSX=0 V, and the disturb voltages are substantially balanced at H Disturb Voltage=1.13 V, and F Disturb Voltage=1.14 V. Similar simulations may be performed to determine desired VUX and VSA values for each count, and the results may be stored in the second table. The second table may be stored in RAM 34 of controller 25 shown in FIG. 2. The count of predetermined data values for the selected word line may be used as an index to VUX and VSA values associated with the each count.

Thus, referring again to FIG. 15, at step 1008, the determined count of predetermined data values from step 1006 may be used as an index to the second table, and unselected word line voltage VUX and selected local bit line voltage VSA values associated with the determined count may be extracted from the second table.

At step 1010, the unselected word line voltage VUX and selected local bit line voltage VSA are set to the values determined in step 1008. For example, controller 25 of FIG. 2 may cause word line select circuits 27 and local bit line select circuits 29 to set unselected word line voltage VUX and selected local bit line voltage VSA to the values determined in step 908.

At step 1012, a write operation is performed on the selected memory cell(s).

Figure 16:
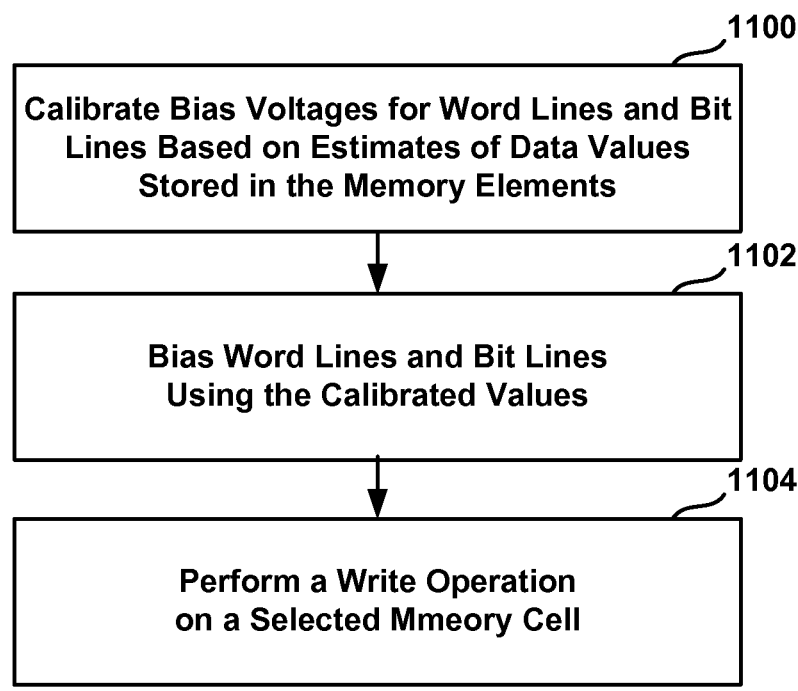
FIG. 16 a flowchart describing an embodiment of a process for operating a non-volatile storage system.

FIG. 16 depicts a flow diagram of an example process for operating a non-volatile storage system that includes a plurality of bit lines, a plurality of word line combs each comprising a plurality of word lines, and a plurality of resistance-switching memory elements, each resistance-switching memory element coupled between one of the bit lines and one of the word lines. In one embodiment, the process of FIG. 16 may be performed by a memory system or by a memory controller, such as controller 25 in FIG. 2.

In step 1100, bias voltages for word lines and bit lines are calibrated based on estimates of data values stored in the memory elements. The estimates of data values may be based on measurements of currents conducted in the memory system, and/or based on counts of predetermined data values stored in the resistance-switching memory elements, as described above.

In step 1102, the word lines and bit lines are biased using the calibrated values.

In step 1104, a write operation is performed on a selected resistance-switching memory element of the non-volatile storage system.

One embodiment of the disclosed technology includes a method for operating a non-volatile storage system. The non-volatile storage system includes a plurality of bit lines, a plurality of word line combs each comprising a plurality of word lines, and a plurality of resistance-switching memory elements. Each resistance-switching memory element is coupled between one of the bit lines and one of the word lines. The method includes calibrating a plurality of bias voltages for the word lines and bit lines based on estimates of data values stored in the resistance-switching memory elements.

One embodiment of the disclosed technology includes a non-volatile storage system that includes a memory array and a managing circuit in communication with the memory array. The memory array includes a plurality of bit lines, a word line comb including a plurality of word lines, and a plurality of rewriteable non-volatile memory cells. Each memory cell includes a reversible resistance-switching element. Each of the plurality of rewriteable non-volatile memory cells is coupled between one of the bit lines and one of the word lines. The managing circuit is configured to perform a first calibration of a plurality of bias voltages for the plurality of bit lines and the plurality of word lines, and perform a second calibration of the plurality of bias voltages for the plurality of bit lines and the plurality of word lines.

One embodiment of the disclosed technology includes method for operating a non-volatile storage system. The non-volatile storage system includes a plurality of bit lines, a plurality of word lines, and a plurality of resistance-switching memory elements. Each resistance-switching memory element is coupled between one of the bit lines and one of the word lines. The method includes performing a read-before-write operation on a first plurality of the resistance-switching memory elements coupled to one of the word lines, determining a count of a number of the first plurality of the resistance-switching memory elements that comprise a predetermined data value, and calibrating a plurality of bias voltages for the plurality of word lines and the plurality of bit lines based on the determined count.

For purposes of this document, reference in the specification to "an embodiment," "one embodiment," "some embodiments," or "another embodiment" may be used to described different embodiments and do not necessarily refer to the same embodiment.

For purposes of this document, a connection can be a direct connection or an indirect connection (e.g., via another part).

For purposes of this document, the term "set" of objects, refers to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

The invention claimed is:

1. A method comprising:
   determining bias voltages for a non-volatile storage system comprising a plurality of bit lines, first and second word line combs, each word line comb comprising a plurality of word lines, a plurality of memory elements, each memory element coupled between one of the bit lines and one of the word lines, a first memory element coupled between the one of the bit lines and a word line of the second word line comb, and a second memory element coupled between a word line of the first word line comb and a second one of the bit lines, by:
      estimating a data pattern previously stored in a plurality of memory elements coupled to the first word line comb; and
      determining a first bias voltage of one of the bit lines and a second bias voltage of the second word line comb based on the estimate of the previously stored data pattern for a predetermined bias voltage for the first word line comb,
   wherein the first bias voltage and the second bias voltage are determined such that a first voltage across the first memory element substantially balances a second voltage across the second memory element.

2. The method of claim 1, wherein estimating comprises:
   biasing the first word line comb to a first voltage;
   biasing the second word line comb to a second voltage;
   biasing the plurality of bit lines coupled to the first word line comb to a third voltage; and
   measuring a current conducted by the first word line comb.

3. The method of claim 2, wherein:
biasing the plurality of bit lines coupled to the first word line comb comprises coupling the plurality of bit lines coupled to the first word line comb to a driver circuit; and
measuring a current conducted by the first word line comb comprises measuring a current conducted by the driver circuit.

4. The method of claim 1, wherein estimating comprises:
biasing the first word line comb to a first voltage;
biasing the second word line comb to a second voltage;
floating the plurality of bit lines coupled to the first word line comb; and
measuring a current conducted by the first word line comb.

5. The method of claim 4, wherein:
biasing the first word line comb comprises coupling the first word line comb to a driver circuit; and
measuring a current conducted by the first word line comb comprises measuring a current conducted by the driver circuit.

6. The method of claim 4, wherein:
biasing the second word line comb comprises coupling the second word line comb to a driver circuit; and
measuring a current conducted by the first word line comb comprises measuring a current conducted by the driver circuit.

7. The method of claim 1, wherein the first memory element and the second memory element are unselected memory elements.

8. An apparatus comprising:
a plurality of bit lines;
first and second word line combs, each word line comb comprising a plurality of word lines;
a plurality of memory elements, each coupled between one of the bit lines and one of the word lines;
a first memory element coupled between the one of the bit lines and a word line of the second word line comb;
a second memory element coupled between a word line of the first word line comb and a second one of the bit lines; and
a memory controller configured to:
measure a total current conducted by the first word line comb;
estimate a data pattern of a plurality of memory elements coupled to the first word line comb based on the measured current; and
determine, for a predetermined bias voltage for the first word line comb, a first bias voltage of one of the bit lines and a second bias voltage of the second word line comb based on the estimated data pattern, such that a first voltage across the first memory element substantially balances a second voltage across the second memory element.

9. The apparatus of claim 8, wherein:
the memory controller is further configured to:
bias the first word line comb to a first voltage;
bias the second word line comb to a second voltage; and
couple a driver circuit to bias the plurality of bit lines coupled to the first word line comb to a third voltage; and
measuring a current conducted by the first word line comb comprises measuring a current conducted by the driver circuit.

10. The apparatus of claim 8, wherein:
the memory controller is further configured to:
couple a first driver circuit to bias the first word line comb to a first voltage;
couple a second driver circuit to bias the second word line comb to a second voltage; and
float the plurality of bit lines coupled to the first word line comb; and
measuring a current conducted by the first word line comb comprises measuring a current conducted by the first driver circuit or the second driver circuit.

11. The apparatus of claim 8, wherein the first memory element and the second memory element are unselected memory elements.

12. The apparatus of claim 8, wherein the memory controller is further configured to:
perform a read operation of a plurality of memory elements coupled to a word line of the first word line comb;
determine a count of a number of the plurality of memory elements coupled to a word line of the first word line comb having a predetermined data state; and
determine the first bias voltage and the second bias voltage based on the determined count.

13. A non-volatile storage system, comprising:
a memory array comprising a plurality of bit lines, first and second word line combs, each word line comb comprising a plurality of word lines, a plurality of memory elements, each memory element coupled between one of the bit lines and one of the word lines, a first memory element coupled between the one of the bit lines and a word line of the second word line comb, and a second memory element coupled between a word line of the first word line comb and a second one of the bit lines; and
a managing circuit in communication with the memory array, the managing circuit configured to:
estimate a data pattern previously stored in a plurality of memory elements coupled to the first word line comb; and
determine a first bias voltage of one of the bit lines and a second bias voltage of the second word line comb based on the estimated data pattern for a predetermined bias voltage for the first word line comb, such that a first voltage across the first memory element substantially balances a second voltage across the second memory element.

14. The non-volatile storage system of claim 13, wherein the managing circuit is further configured to:
bias the first word line comb to a first voltage;
bias the second word line comb to a second voltage;
bias the plurality of bit lines coupled to the first word line comb to a third voltage; and
measure a current conducted by the first word line comb.

15. The non-volatile storage system of claim 14, wherein:
biasing the plurality of bit lines comprises coupling a driver circuit to the plurality of bit lines coupled to the first word line comb; and
measuring a current conducted by the first word line comb comprises measuring a current conducted by the driver circuit.

16. The non-volatile storage system of claim 13, wherein the managing circuit is further configured to:
bias the first word line comb to a first voltage;
bias the second word line comb to a second voltage;
float the plurality of bit lines coupled to the first word line comb; and
measure a current conducted by the first word line comb.

17. The non-volatile storage system of claim 16, wherein:
biasing the first word line comb comprises coupling the first word line comb to a driver circuit; and
measuring a current conducted by the first word line comb comprises measuring a current conducted by the driver circuit.

18. The non-volatile storage system of claim 16, wherein:
biasing the second word line comb comprises coupling the second word line comb to a driver circuit; and
measuring a current conducted by the first word line comb comprises measuring a current conducted by the driver circuit.

* * * * *